US012519093B2

(12) United States Patent
Tsutsui

(10) Patent No.: US 12,519,093 B2
(45) Date of Patent: Jan. 6, 2026

(54) SEMICONDUCTOR PACKAGE AND THREE-DIMENSIONAL STACKED INTEGRATED CIRCUIT USING LIQUID IMMERSION COOLING SYSTEM BY PERFORATED INTERPOSER

(71) Applicant: SoftBank Corp., Tokyo (JP)

(72) Inventor: Takashi Tsutsui, Tokyo (JP)

(73) Assignee: SoftBank Corp., Tokyo (JP)

(*) Notice: Subject to any disclaimer, the term of this patent is extended or adjusted under 35 U.S.C. 154(b) by 634 days.

(21) Appl. No.: 17/721,379

(22) Filed: Apr. 15, 2022

(65) Prior Publication Data

US 2022/0238498 A1    Jul. 28, 2022

Related U.S. Application Data

(63) Continuation of application No. PCT/JP2020/043916, filed on Nov. 25, 2020.

(30) Foreign Application Priority Data

Dec. 5, 2019  (JP) ................................. 2019-220566

(51) Int. Cl.
*H01L 25/10*         (2006.01)
(52) U.S. Cl.
CPC .... *H01L 25/105* (2013.01); *H01L 2225/1041* (2013.01); *H01L 2225/1058* (2013.01);
(Continued)
(58) Field of Classification Search
CPC ..... H01L 25/105; H01L 23/44; H01L 25/065; H01L 25/07; H01L 25/18; H01L 25/08;
(Continued)

(56) References Cited

U.S. PATENT DOCUMENTS 4,356,047 A * 10/1982 Gordon ................... H01L 23/10
228/208
5,119,485 A *  6/1992 Ledbetter, Jr. ...... G06F 12/0835
711/146
(Continued)

FOREIGN PATENT DOCUMENTS

CN        1716587 A     1/2006
CN     203250734 U    10/2013
(Continued)

OTHER PUBLICATIONS

Examination Report for counterpart UK Application No. 2205750.9, issued by the Intellectual Property Office of UK on Mar. 11, 2024.
(Continued)

*Primary Examiner* — Julio J Maldonado
*Assistant Examiner* — Paul A Berry

(57) ABSTRACT

A three-dimensional stacked integrated circuit is configured such that a package provided with a semiconductor chip and an interposer substrate provided with an opening are alternately stacked with respective electrode terminals and electrode pads, the package and the interposer substrate include electrode terminals having a shape in which a gap is generated between the electrode terminals in a stacking direction in a stacked state, an electrode pad for connecting the electrode terminals, and a guide hole for holding accurate positioning and connection at a time of stacking, an interlayer communication path is formed by connecting the package and the interposer substrate, and a cooling liquid flows through the gap to perform liquid immersion cooling.

22 Claims, 18 Drawing Sheets

(52) U.S. Cl.
CPC ............... *H01L 2225/1082* (2013.01); *H01L 2225/1094* (2013.01)

(58) Field of Classification Search
CPC ........... H01L 2225/107; H01L 25/0657; H01L 2924/15311; H01L 25/0756; H01L 25/162; H01L 2223/6616; H01L 2225/1094; H01L 25/11; H01L 23/49822; H01L 23/5385; H01L 25/10–13; H01L 2225/1058; H01L 2225/1082; H01L 23/49811; H01L 2225/104; H01L 2224/75754–75756; H01L 2224/80121–80132; H01L 2225/10–1094; H01L 23/498–49894; H01L 2224/76754–76756; H01L 2224/77754–77756; H01L 2224/78754–78756; H01L 2224/79754–79756; H01L 2224/80136–80141; H01L 2224/81136–81141; H01L 2224/82136–82138; H01L 2224/83136–83141; H01L 2224/84136–84138; H01L 2224/85136–85138; H01L 2224/86136–86138; H01L 2224/95136; H01L 2021/6009; G11C 5/025; G11C 5/04; H05K 7/08

See application file for complete search history.

(56) References Cited

U.S. PATENT DOCUMENTS

| | | | | |
|---|---|---|---|---|
| 5,200,631 A * | 4/1993 | Austin | ............... | H01L 31/02327 257/E31.127 |
| 5,380,956 A | 1/1995 | Loo | | |
| 5,785,754 A | 7/1998 | Yamamoto | | |
| 5,788,766 A | 8/1998 | Yamamoto | | |
| 6,359,331 B1 * | 3/2002 | Rinehart | ............... | H01L 25/115 257/691 |
| 7,532,538 B2 * | 5/2009 | Choi | ............... | G11C 7/1057 365/233.13 |
| 10,097,184 B2 | 10/2018 | Wu | ............... | H03K 19/018528 |
| 2001/0026010 A1 * | 10/2001 | Horiuchi | ............ | H01L 23/3107 257/E21.511 |
| 2004/0251530 A1 | 12/2004 | Yamaji | | |
| 2006/0001179 A1 | 1/2006 | Fukase | | |
| 2007/0085198 A1 | 4/2007 | Shi | | |
| 2008/0036064 A1 | 2/2008 | Han | | |
| 2008/0150162 A1 | 6/2008 | Koizumi | | |
| 2010/0187683 A1 | 7/2010 | Bakir | | |
| 2012/0136596 A1 | 5/2012 | Yamaoka | | |
| 2013/0141442 A1 * | 6/2013 | Brothers | ............... | G06T 1/20 345/502 |
| 2013/0187275 A1 | 7/2013 | Ohira | | |
| 2014/0015119 A1 | 1/2014 | Bonkohara | | |
| 2014/0027895 A1 | 1/2014 | Mizuno | | |
| 2014/0159041 A1 | 6/2014 | Yamaoka | | |
| 2015/0348952 A1 | 12/2015 | Refai-Ahmed | | |
| 2016/0013114 A1 | 1/2016 | Vadhavkar | | |
| 2016/0321207 A1 * | 11/2016 | Apfelbaum | ......... | G06F 12/1009 |
| 2016/0351471 A1 | 12/2016 | Suwada | | |
| 2016/0372448 A1 * | 12/2016 | Yazdani | ............... | H01L 23/04 |
| 2017/0186728 A1 | 6/2017 | Chainer | | |
| 2018/0068938 A1 * | 3/2018 | Yazdani | ............... | H01L 21/486 |
| 2020/0402888 A1 | 12/2020 | Tsutsui | | |

FOREIGN PATENT DOCUMENTS

| | | | |
|---|---|---|---|
| JP | H07142657 A | 6/1995 | |
| JP | H08227953 A | 9/1996 | |
| JP | 2005005529 A | 1/2005 | |
| JP | 2008047894 A | 2/2008 | |
| JP | 2008159619 A | 7/2008 | |
| JP | 2009512215 A | 3/2009 | |
| JP | 2009099683 A | 5/2009 | |
| JP | 2013153083 A | 8/2013 | |
| JP | 2014187228 A | 10/2014 | |
| JP | 2015226061 A | 12/2015 | |
| JP | 2015232500 A | 12/2015 | |
| JP | 2015233099 A | 12/2015 | |
| JP | 2016219733 A | 12/2016 | |
| JP | 2017525150 A | 8/2017 | |
| JP | 2019146724 A | 9/2019 | |
| TW | 261171 B1 * | 9/2006 | |
| TW | I261171 B * | 9/2006 | |
| WO | 2011030467 A1 | 3/2011 | |
| WO | 2012091044 A1 | 7/2012 | |
| WO | 2012132019 A1 | 10/2012 | |
| WO | 2019146724 A1 | 8/2019 | |

OTHER PUBLICATIONS (ISA/237) Written Opinion of the International Search Authority for International Patent Application No. PCT/JP2020/043916, issued/mailed by the Japan Patent Office on Feb. 16, 2021.

(ISA/237) Written Opinion of the International Search Authority for International Patent Application No. PCT/JP2018/002310, issued/mailed by the Japan Patent Office on Apr. 10, 2018.

(ISA/237) Written Opinion of the International Search Authority for International Patent Application No. PCT/JP2018/038379, issued/mailed by the Japan Patent Office on Jan. 8, 2019.

(ISA/237) Written Opinion of the International Search Authority for International Patent Application No. PCT/JP2018/041184, issued/mailed by the Japan Patent Office on Jan. 15, 2019.

International Preliminary Report on Patentability for International Application No. PCT/JP2019/002351, issued by the International Bureau of WIPO on Apr. 15, 2020.

Office Action issued for related Chinese Application 201980009678.7, issued by the State Intellectual Property Office of People's Republic of China on Dec. 4, 2023.

* cited by examiner

The contents of the following patent applications are incorporated herein by reference:
Japanese patent application NO. 2019-220566 filed on Dec. 5, 2019, and
International Application NO. PCT/JP2020/043916 filed on Nov. 25, 2020

SEMICONDUCTOR PACKAGE AND THREE-DIMENSIONAL STACKED INTEGRATED CIRCUIT USING LIQUID IMMERSION COOLING SYSTEM BY PERFORATED INTERPOSER

BACKGROUND

1. Technical Field

The present invention relates to a three-dimensional stacked integrated circuit having a cooling function by a refrigerant and a cooling method of the three-dimensional stacked integrated circuit.

2. Related Art

There is a technique for mounting a three-dimensionally stacked semiconductor. For example, the applicant discloses a three-dimensional stacked integrated circuit including interposers between respective integrated circuits of the three-dimensional stacked integrated circuit and below a lowermost integrated circuit, in which a refrigerant movement path is provided in each of a plurality of the interposers, and the plurality of refrigerant movement paths provided in the plurality of interposers are connected to each other (see Patent Document 1).

PRIOR ART DOCUMENT

Patent Document

Patent Document 1: International Publication No. 2019/146724

In the first place, a heat dissipation plate does not function effectively even if it is inserted between the stacked semiconductors. The thermal resistance is too large to release heat from the metal plate in the lateral direction. Regarding metal, the thermal resistance ($\Psi$jt) is proportional to the thermal conduction distance of the metal, and when Tj=$\Psi$jt× P+Tcl (Tj is junction temperature, $\Psi$jt is thermal resistance, P is power consumption, Td is environmental temperature) and $\Psi$jt increases, power consumption cannot be applied.

FIG. 15 is a sectional view schematically illustrating how heat propagates by installing a heat dissipation plate on a semiconductor chip that generates heat. The entire semiconductor chip serves as a heating element, but the heating portions are referred to as point heat sources of heating points A, B, and C in order to describe how heat is transferred to the heat dissipation plate. The heat spreads from the point heat source to the heat dissipation plate in a hemispherical shape (illustrated as a semicircle in the sectional view of FIG. 15). Heat propagates concentrically from the center heating point B, but hardly propagates in the left and right directions since there is heat from the left and right heating points A to B and thermal resistance is large. On the other hand, since the thermal resistance is low in the upward direction, a heat dissipation fin B and the heat dissipation fins around the heat dissipation fin B effectively act. On the other hand, at the heating point A, the heat propagates upward and leftward because the thermal resistance is large in the right direction due to the heat from the center heating point B. Similarly, at the heating point C, the heat propagates upward and rightward because the thermal resistance is large in the left direction due to the heat from the center heating point B. The heat dissipation plate is sufficiently larger than the semiconductor chip because the heat dissipation plate releases heat to the outside with a larger surface area than the heating element. For this reason, since there is no heat source on the left side of the heating point A and the right side of the heating point C, and the thermal resistance is small, heat can be sufficiently dissipated by heat dissipation at the surface area of the heat dissipation plate itself, and there is a possibility that the heat dissipation fins at the outer edge portions of the heat dissipation fins A to C and the like do not effectively act. In order to make the heat dissipation fin such as the heat dissipation fin B immediately above the semiconductor chip as the heating element effective, it is only required to reduce the thickness of the heat dissipation plate to bring the heating point and the heat dissipation fin close to each other as illustrated in FIG. 16. However, if the thickness of the heat dissipation plate is reduced, the thermal resistance of the heat dissipation plate increases, and heat conduction from the heating point to the heat dissipation plate other than the immediately upper portion is less likely to occur, so that the heat dissipation is failed. Therefore, the heat dissipation plate is not allowed to be thick or thin. In particular, in a case where a semiconductor chip is not accommodated in a BGA package or the like and three-dimensional immersion is assumed, even if the heat dissipation plate is sandwiched between the semiconductor chips, the effectiveness of the heat dissipation plate is still questionable.

In an efficient method of a three-dimensional semiconductor (three-dimensional mounting of a high-heat generating arithmetic circuit such as a CPU or a GPU) on the premise of liquid immersion by an FC-BGA package including electrode pads on its surface in which a semiconductor is packaged and then immersed, directly immersed in liquid without three-dimensional implementation with the TSV described above, the semiconductor substrate portion (the opposite side of the circuit mounting portion of the semiconductor, which is cut out so as to be as thin as possible) is directly immersed as it is (in that case, it is assumed that the FC portion is sealed with an underfill), or a compound is applied, covered with a thin package metal having a good thermal conductivity and immersed in liquid without attaching a heat dissipation fin. Since W=J/s, it is only necessary to set a surface area flow rate of only a necessary effective surface area by pressure-feeding a refrigerant in unit of m²/s (the surface area of the semiconductor is about 1 cm²/s, for example, if the effective surface area of one square centimeter is 10 times insufficient on the premise of boiling and heat dissipation, thus a flow rate of 10 cm²/s may be allowed to flow).

For example, when the refrigerant is fluorochemical liquid, the thermal conductivity is about 0.5 W/cm² ° C. However, when the above formula is modified, P=(Tj−Tcl)× 1/$\Psi$jt is satisfied. Therefore, if Tj is 85° C. and the boiling point of the fluorochemical liquid is 56° C., a temperature difference of 29° C. is obtained for Tj−Tcl, but P is 58 W. However, for example, when the CPU is 1 cm² with 200 W, a flow rate of about 4 cm/s may be pressure-fed and caused to flow.

When the semiconductor is a GPGPU of 1 cm² with 1 kW, it is sufficient that the semiconductor is boiled and cooled by flowing a flow rate of about 20 cm/s. This is rather innovative, and even when 10 layers of 1 kW GPGPU are stacked to form a super computer, it is sufficient to apply a flow rate of about 20 cm/s from the side to all layers by immersion. This is not special because it is usually put into practical use in a laser oscillator or the like.

According to the present invention, when the FC-BGA package having electrode pads on the surface is stacked, it is possible to secure a space for accommodating the stacked ceramic capacitor (in the portion of a hole) on the back surface of the semiconductor of the FC-BGA package having electrode pads on the surface by inserting a perforated interposer substrate, and to secure a space for stably securing the above-described necessary flow rate.

In the related art, a three-dimensional semiconductor is regarded as one lump, and attention is paid to a flow path of a refrigerant for cooling the semiconductor inside the three-dimensional semiconductor. However, it has not been considered where a ceramic capacitor is disposed in order to operate a semiconductor chip that consumes a large current, such as a central processing unit (CPU) also called a processor, a general-purpose computing on graphics processing unit (GPGPU), a base band unit (BBU), or the core of a super computer. It is conceivable to dispose a ceramic capacitor on the uppermost surface or the bottom surface of the three-dimensional semiconductor, but for the semiconductor chip in the central layer, a power supply path passing through each layer from the ceramic capacitor to the semiconductor chip becomes long, so that impedance increases, and a large current cannot be supplied to the semiconductor chip. The present invention is a proposal for solving the problem of reference document WO 2019/146724 in which a ball grid array (BGA) terminal of a circuit from each layer of a semiconductor package substrate (also referred to as a flip chip-Ball grid array (FC-BGA) substrate) on which a processor is mounted to a ceramic capacitor is removed, and the ceramic capacitor is attached to each layer of the semiconductor package substrate to lower the impedance of the circuit to enable large current power supplying, and to realize three-dimensional cooling by liquid immersion.

General Disclosure

In Reference Document WO 2019/146724, by overlapping the FC-BGA package having the electrode pad on the surface, the interval between the ceramic capacitor at the lower part of the package and the heat spreader at the upper part of the package is narrowed, and there is a possibility that the flow rate cannot be expected even if the package is immersed in liquid. The present invention proposes a device and a method for constructing an immersion three-dimensional arithmetic device securing a space a flow rate of fluorinert liquid for liquid immersion and a space for disposing a ceramic capacitor in a lower portion of the BGA package without significantly modifying the existing FC-BGA package, in which an interval is secured between the ceramic capacitor and the heat spreader by inserting a substrate having pads and BGA (hereinafter, referred to as a "perforated interposer substrate") in which pads and BGA electrodes are vertically attached at positions where the semiconductor chip is not mounted, square holes are formed in the heat spreader portion, and the BGA electrodes are electrically vertically penetrated as if in a sense of wearing clogs when the Goemon bath is not covered.

(1) A three-dimensional stacked integrated circuit on a premise of immersion in which a package provided with a semiconductor chip and an interposer substrate provided with an opening at a position where the semiconductor chip is mounted are alternately stacked with respective electrode terminals and electrode pads, wherein the package and the interposer substrate have a shape in which a gap is generated between the electrode terminals in a stacking direction according to electrode terminals on a lower surface, electrode pads having a geometric shape for connecting the electrode terminals are provided on upper surfaces of the package and the interposer substrate, the electrode terminals and the electrode pads of the package and the interposer substrate are vertically electrically connected on a 1:1 basis, guide holes for accurately positioning and holding connection at a time of stacking are provided in the package and the interposer substrate, an interlayer communication path is formed by the electrode terminal and the electrode pad by connecting the package and the interposer substrate, and a cooling liquid flows in a gap generated between the electrode terminals of the package and the interposer substrate to perform liquid immersion cooling.

(2) The three-dimensional stacked integrated circuit according to (1), wherein a plurality of the interposer substrates, each of which is inserted between the packages, is continuously inserted.

(3) The three-dimensional stacked integrated circuit according to (1) and (2), wherein the semiconductor chip mounted in the package is a three-dimensional semiconductor (HBM: High Bandwidth Memory, Wide I/O DRAM, or the like) obtained by stacking two or more layers.

(4) The three-dimensional stacked integrated circuit according to (1) to (3), wherein the package has a cross-connected non-uniform memory access (NUMA) configuration, and interconnections of the packages are bus connections.

(5) The three-dimensional stacked integrated circuit according to (1) to (4), wherein the guide holes have a function as an anode electrode and a cathode electrode for supplying power to the semiconductor chip mounted on the package, and the guide holes are provided two by two adjacent to each other to lower impedance so that power can be directly supplied to a ceramic capacitor mounted on the package.

(6) The three-dimensional stacked integrated circuit according to (1) to (5), wherein a data transmission system of the interlayer communication path formed by the electrode terminal and the electrode pad is implemented by low voltage differential (LVD) with the two adjacent electrode terminals as a pair.

(7) The three-dimensional stacked integrated circuit according to (1) to (5), wherein a data transmission system of the interlayer communication path formed by the electrode terminal and the electrode pad is implemented by PCI Express with the two adjacent electrode terminals as a pair.

(8) The three-dimensional stacked integrated circuit according to (7), wherein clocked-up PCI Express is used.

(9) The three-dimensional stacked integrated circuit according to (1) to (8), wherein a bidirectional tri-state gate driver is mounted adjacent to the electrode terminal of the package in order to reduce an adverse effect of reflection of a high-frequency signal flowing through the interlayer communication path.

(10) The three-dimensional stacked integrated circuit according to (1) to (9), wherein a heat spreader closely attached to the semiconductor chip mounted on the package is a sintered metal or a metal oxide in order to prevent cavitation caused by intermittent boiling in liquid immersion cooling.

(11) The three-dimensional stacked integrated circuit according to (1) to (10), wherein an integrated circuit of a lowermost layer of the three-dimensional stacked integrated circuit is configured by a bus driver switch or a bus driver buffer switch of a DMA with a buffer with address bus snooping in units of page.

According to the present invention, since the liquid immersion cooling can be performed after the separation is secured on the back surface of each layer of a semiconductor package substrate on which the processor is mounted and a gap for attaching a ceramic capacitor is secured, the impedance of the circuit can be lowered and the large current supplying can be performed.

DESCRIPTION OF EXEMPLARY EMBODIMENTS

Figure 1:
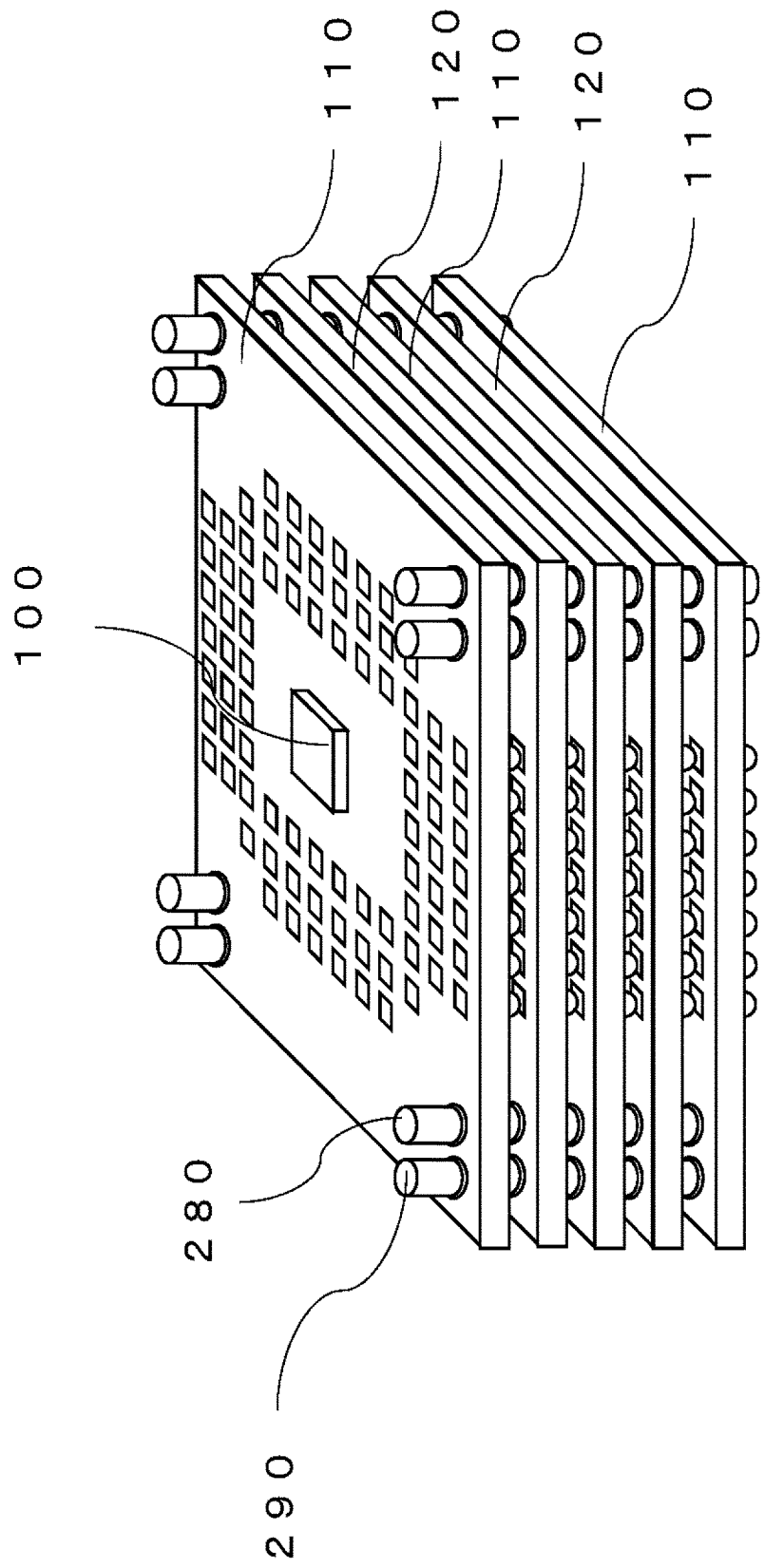
FIG. 1 is a perspective view in which three layers are stacked and coupled in a three-dimensional stacked integrated circuit, which is an example of the present embodiment.

Hereinafter, embodiments of the present invention will be described with reference to the accompanying drawings. The present invention will be described through embodiments of the invention, but the following embodiments do not limit the invention according to the claims. Not all combinations of features described in the embodiments are essential to the solution of the invention. In a three-dimensional stacked integrated circuit of the present embodiment illustrated in the drawings, an FC-BGA package having electrode pads on the surface and one or a plurality of perforated interposer substrates thereon are integrated into one layer, and the FC-BGA package having the electrode pads on the uppermost surface is formed into one layer alone. Note that the FC-BGA package is an example of a package having a terminal having a shape in which a gap is generated between electrode terminals in a stacking direction in the state of being connected to the substrate of the lower layer, and the electrode pad is an example of a pad having a geometric shape. The BGA electrode or the like is an example of an electrode terminal having a shape in which a gap is generated between the electrode terminals in the stacking direction. Note that, in the respective drawings, components denoted by the same reference numerals have the same or similar configurations.

Figure 2:
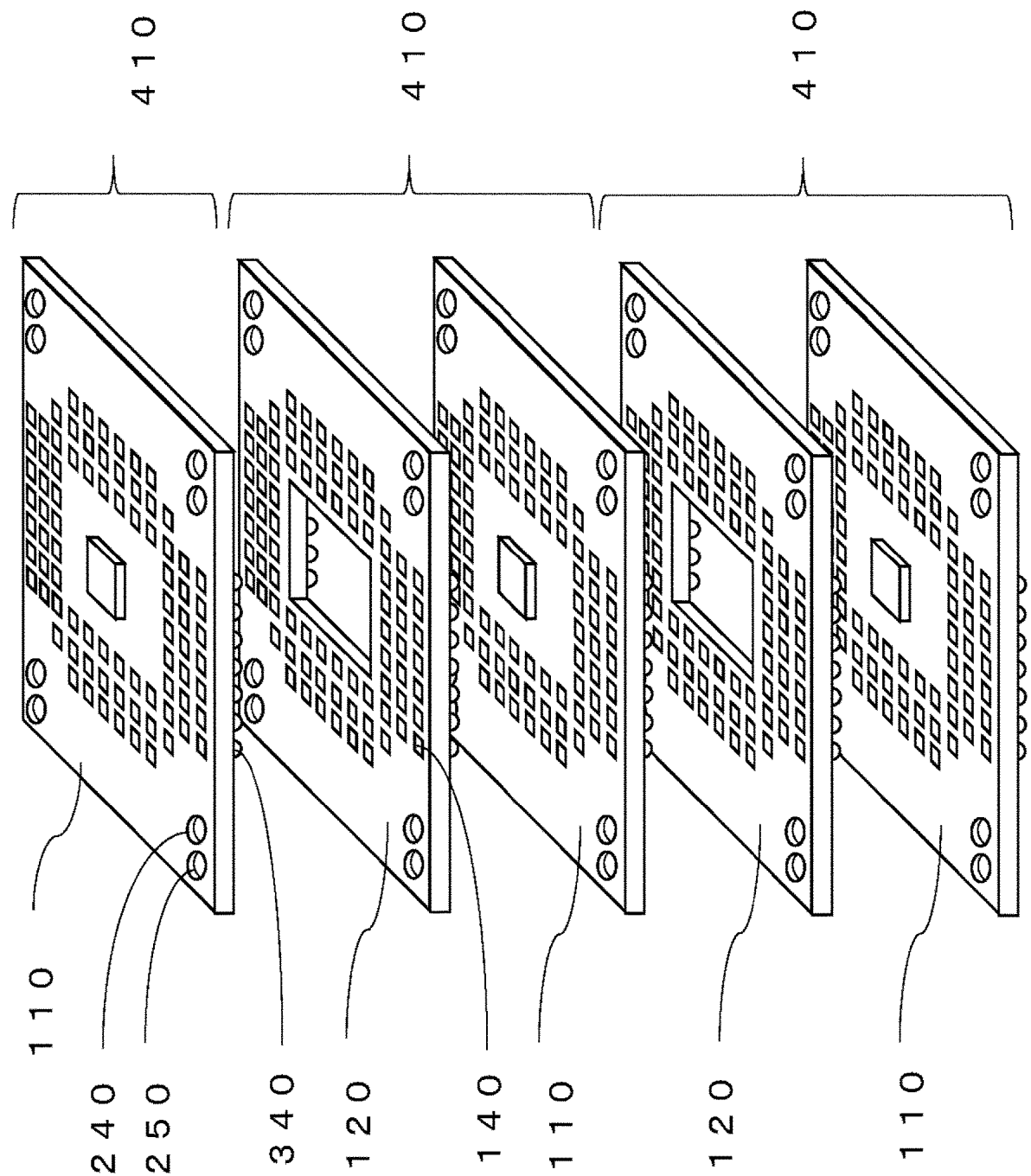
FIG. 2 is a perspective view illustrating overlapping of an FC-BGA package having electrode pads on a surface and a perforated interposer substrate in the case of stacking three layers in a three-dimensional stacked integrated circuit, which is an example of the present embodiment.

The present embodiment will be described with reference to FIG. 1 and FIG. 2. FIG. 1 is a perspective view of the present embodiment. FIG. 2 is a perspective view illustrating a stacked configuration of the present embodiment.

BGA, Clog, Interlayer Communication Path, and Liquid Immersion Cooling

In Reference Document WO 2019/146724, by overlapping the FC-BGA package having the electrode pad on the surface, the interval between the ceramic capacitor at the lower part of the package and a heat spreader at the upper part of the package is narrowed, and there is a possibility that the flow rate cannot be expected even if the package is immersed in liquid. Alternatively, there is also a possibility that they interfere and do not overlap. The present invention proposes a device and a method for constructing an immersion three-dimensional arithmetic device securing a space a flow rate of fluorinert liquid for liquid immersion and a space for disposing a ceramic capacitor in a lower portion of the BGA package without significantly modifying the existing FC-BGA package, in which an interval is secured between the ceramic capacitor and the heat spreader by inserting a substrate having pads and BGA (hereinafter, referred to as a "perforated interposer substrate") in which pads and BGA electrodes are vertically attached at positions where the semiconductor chip is not mounted, square holes are formed in a portion where the heat spreader is originally mounted, and the BGA electrodes are vertically electrically penetrated as if in the sense of clogs of the Goemon bath. The present embodiment is configured, as illustrated in FIG. 1, by stacking an FC-BGA package 110 having electrode pads on the surface on which a semiconductor chip 100 is mounted and a perforated interposer substrate 120.

A Plurality of Clogs may be Continuous

The perforated interposer substrate 120 is for adjusting the flow rate of a refrigerant and the separation between the upper layer and the lower layer, and may be formed by continuously stacking not one but a plurality of perforated interposer substrates.

Electrode and Guide Hole are Provided

Figure 3:
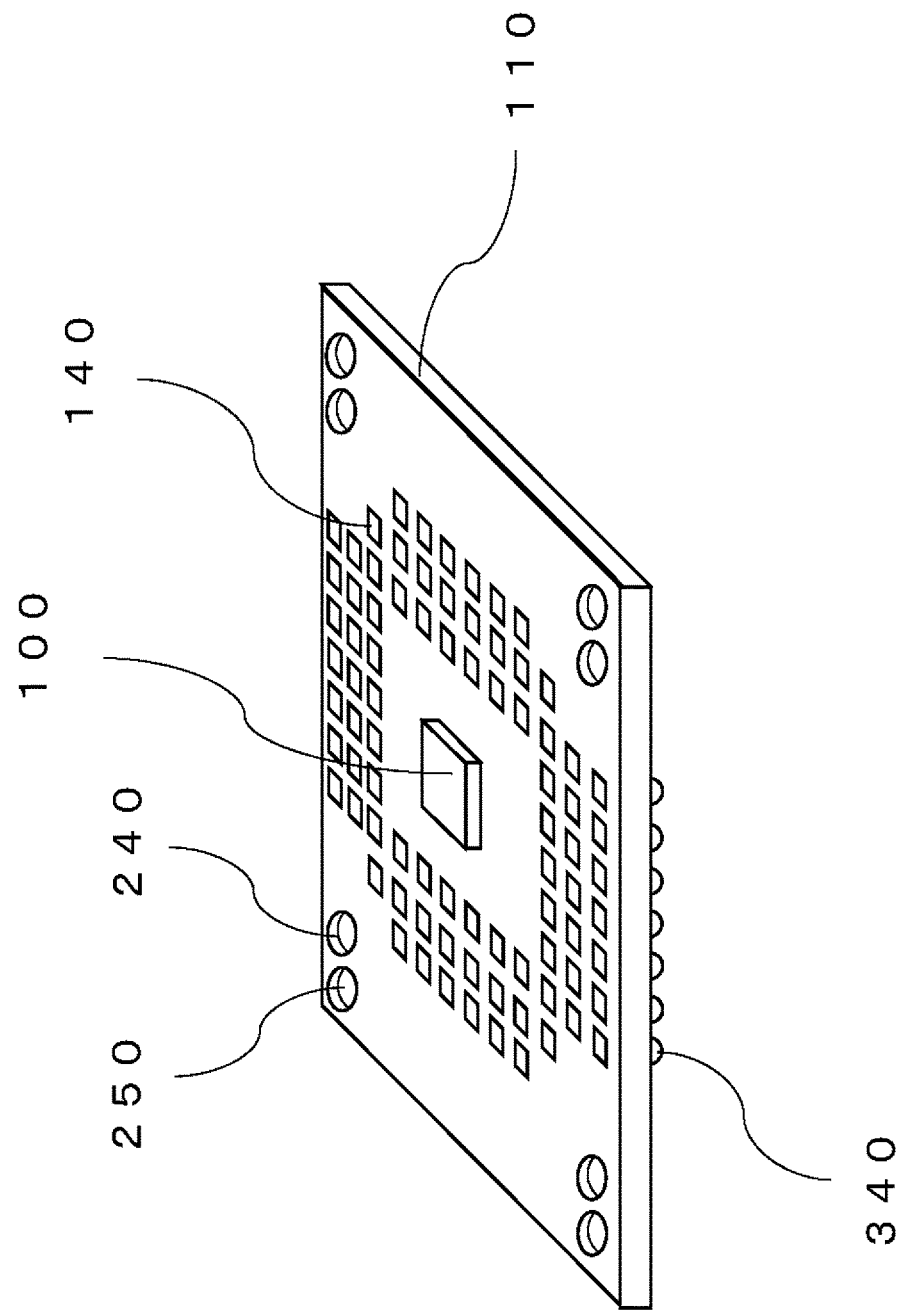
FIG. 3 is a perspective view of the surface of the FC-BGA package having electrode pads on the surface, which is an example of the present embodiment.
Figure 4:
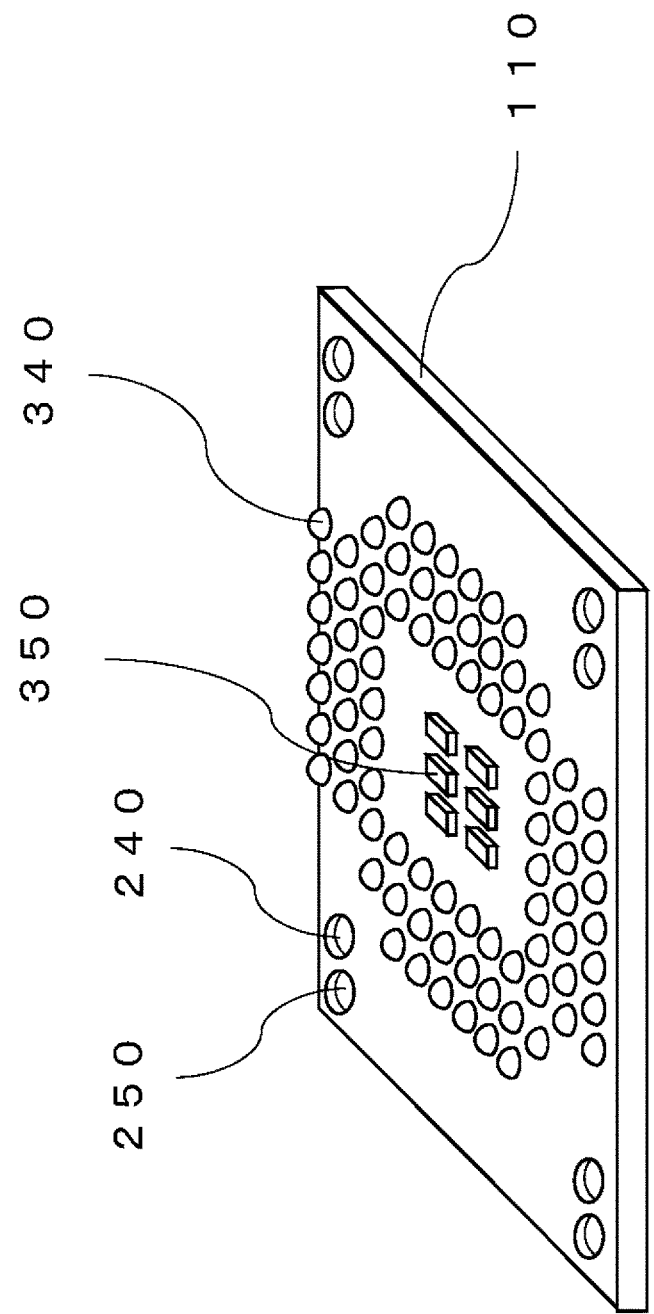
FIG. 4 is a perspective view of a back surface of the FC-BGA package having electrode pads on the surface, which is an example of the present embodiment.
Figure 10:
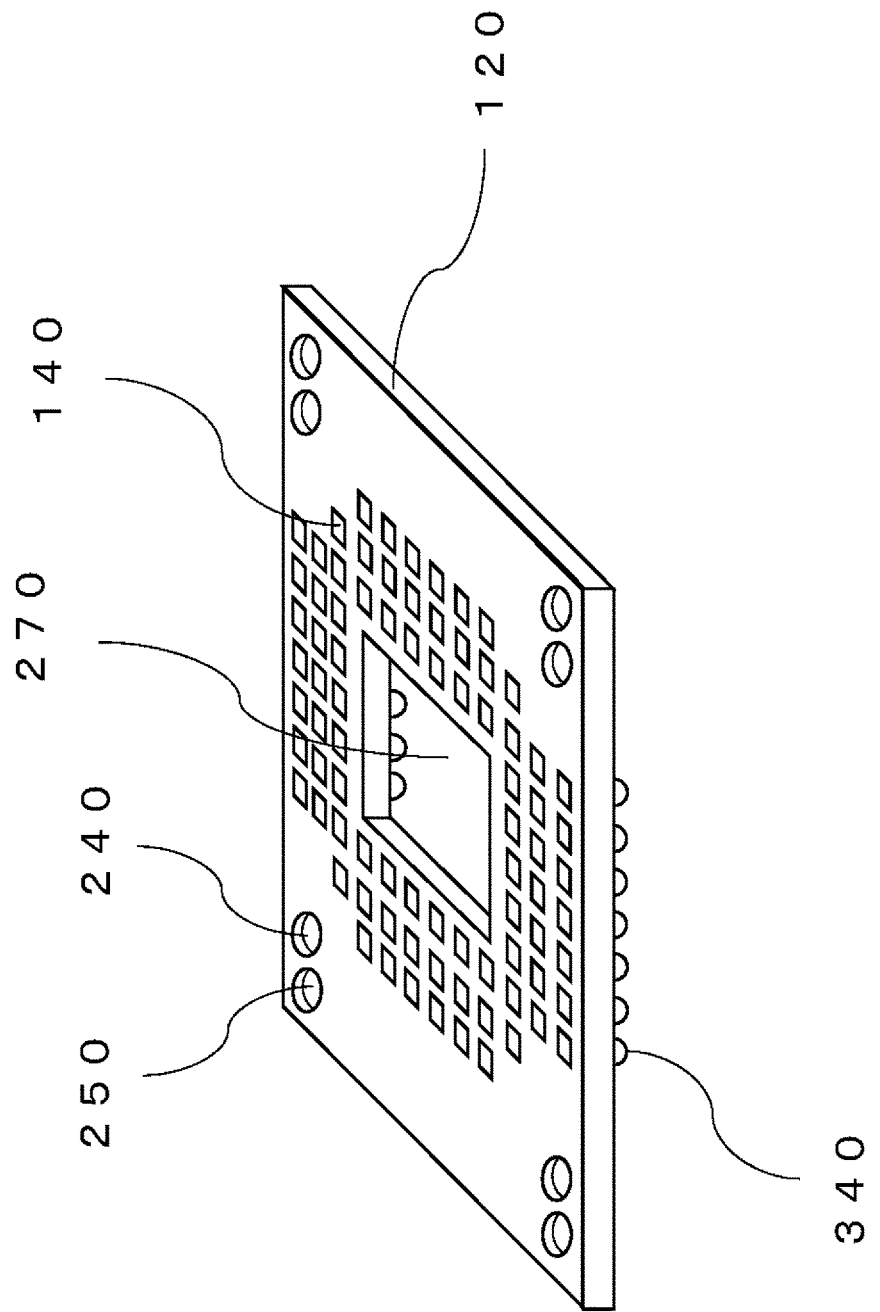
FIG. 10 is a perspective view of the surface of the perforated interposer substrate which is an example of the present embodiment.

As illustrated in FIGS. 3, 4 and FIG. 10, the FC-BGA package 110 having electrode pads on the surface and the perforated interposer substrate 120 includes adjacent through holes for erecting guide pins to supply power to the ceramic capacitor 350 (shown in FIG. 4) with low impedance, that is, a power supply electrode 240 as an anode which is a through hole for erecting a guide pin and a power supply electrode 250 as a cathode which is a through hole for erecting a guide pin.

Interlayer Communication is LVD

Figure 12:
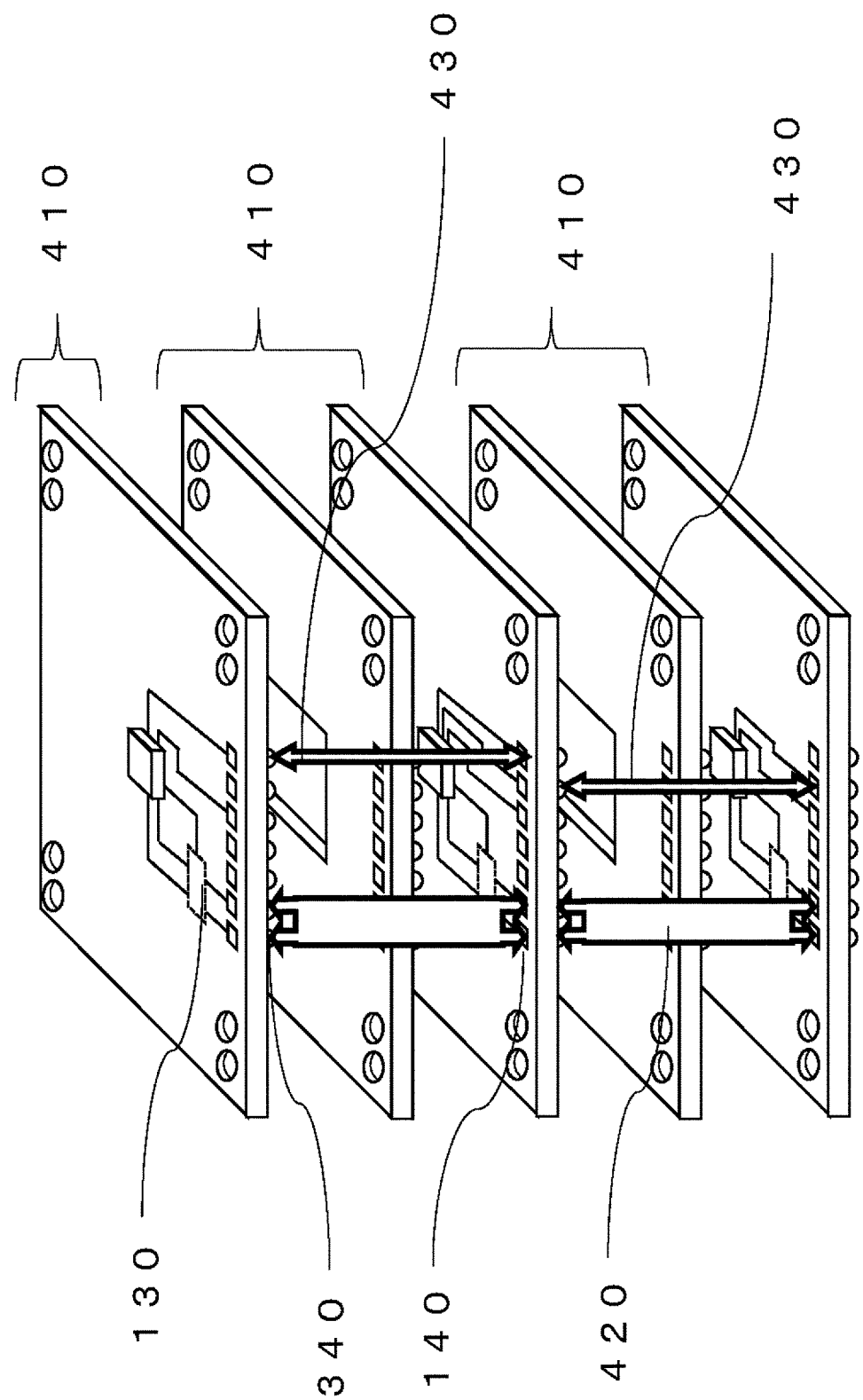
FIG. 12 is a conceptual diagram of an interlayer communication path in the three-dimensional stacked integrated circuit which is an example of the present embodiment.

As illustrated in Fig. 12, an electrode pad 140 and an electrode terminal 340 are bonded to form an interlayer communication path in the three-dimensional stacked integrated circuit in the present embodiment. Among them, a communication path connected across a plurality of layers is referred to as a local bus 420. In the communication scheme of the local bus 420, driving is performed by low voltage differential (LVD) using a pair of two adjacent electrode terminals, thereby alleviating the problem of signal reflection.

Interlayer Communication is PCI Express

The PCI Express standard may be adopted as a communication scheme of the local bus 420 by using two adjacent electrode terminals in pairs.

PCI Express With Clocked up Interlayer Communication

The clocked-up PCI Express standard may be adopted as a communication scheme of the local bus 420 by using two adjacent electrode terminals in pairs. In this case, since the interlayer communication is closed in the present system, it may be freely clock-tuned regardless of the following list. For reference, a revision of PCI Express and a physical layer transfer band (unit is giga transfer per second (GT/sec)) per link width and one direction will be described below.

Figure 17:
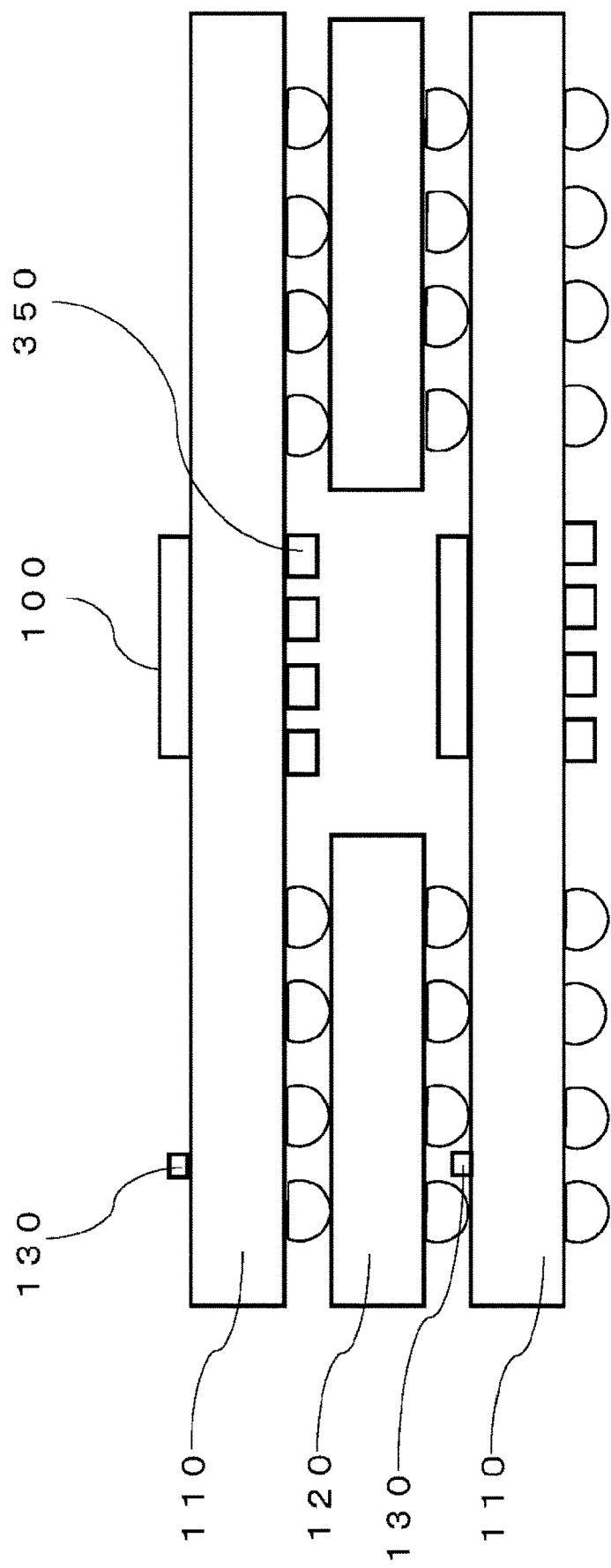
FIG. 17 is a diagram illustrating mounting positions of the bidirectional tri-state gate driver in a side view in which two layers are stacked in the three-dimensional stacked integrated circuit which is an example of the present embodiment.

Gen1 2.5 GT/sec
Gen2 5 GT/sec
Gen3 8 GT/sec
Gen4 16 GT/sec
Gen5 32 GT/sec
Gen6 64 GT/sec Bidirectional Tri-State Gate Driver is Attached to the Side of the Local Bus Interlayer-Coupled With BGA Ball In the local bus 420, in order to prevent an adverse effect due to reflection by a lead wire in each layer formed in a comb shape, a bidirectional tri-state gate driver 130 is provided within an interval between the electrode terminals 340 to be adjacent to the electrode terminals 340 or the electrode pads 140 of each layer as illustrated in FIG. 17. By means of the bidirectional tri-state gate driver, the reflection of the interlayer communication signals remains in the range of interconnections composed of vertical BGA balls as interposers. Therefore, further clock tuning of a layer can be expected.

Sintered Metal or Metal Oxide is Used for Heat Spreader for Ebullient Cooling

Figure 8:
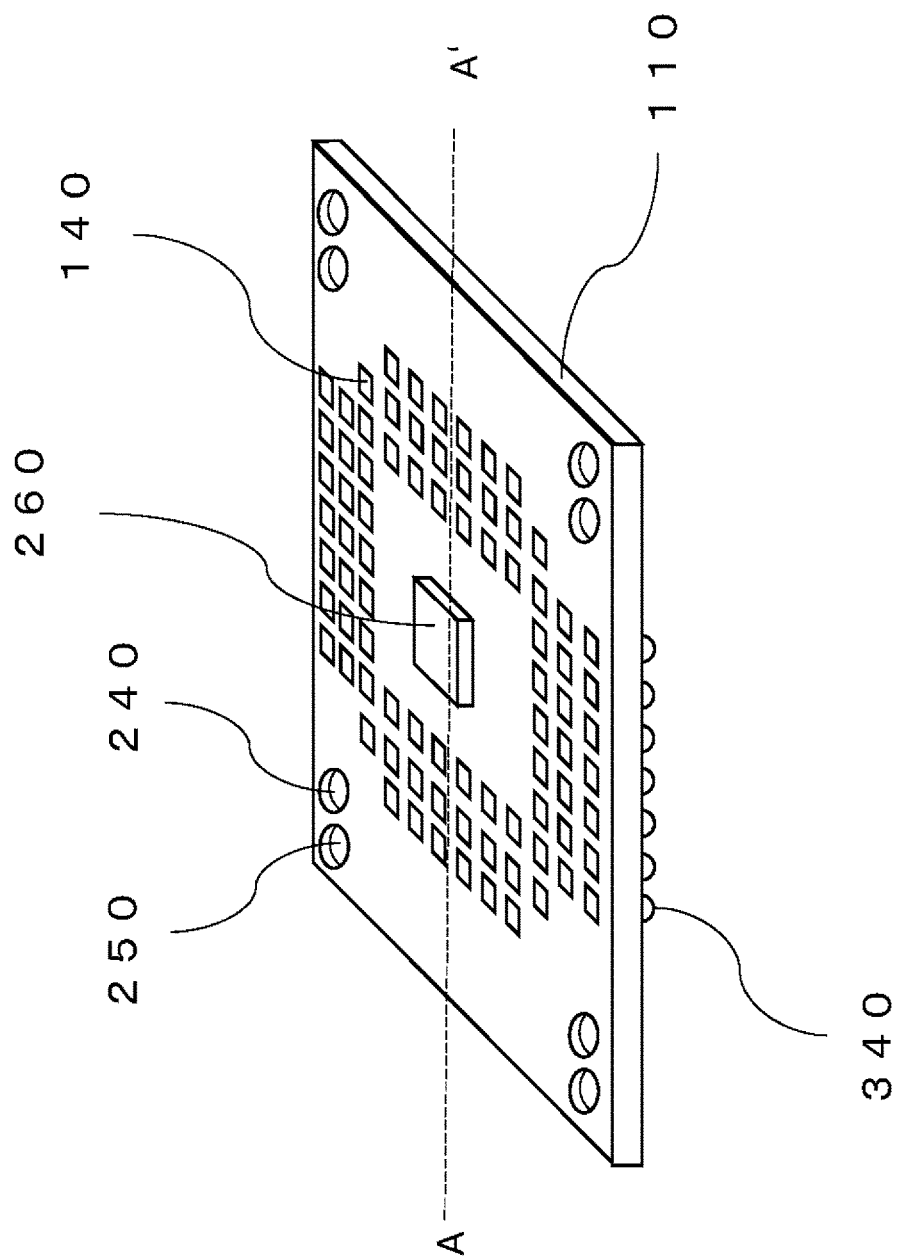
FIG. 8 is a perspective view illustrating a configuration in which a semiconductor chip is covered with a heat spreader in the FC-BGA package having electrode pads on the surface, which is an example of the present embodiment.
Figure 9:
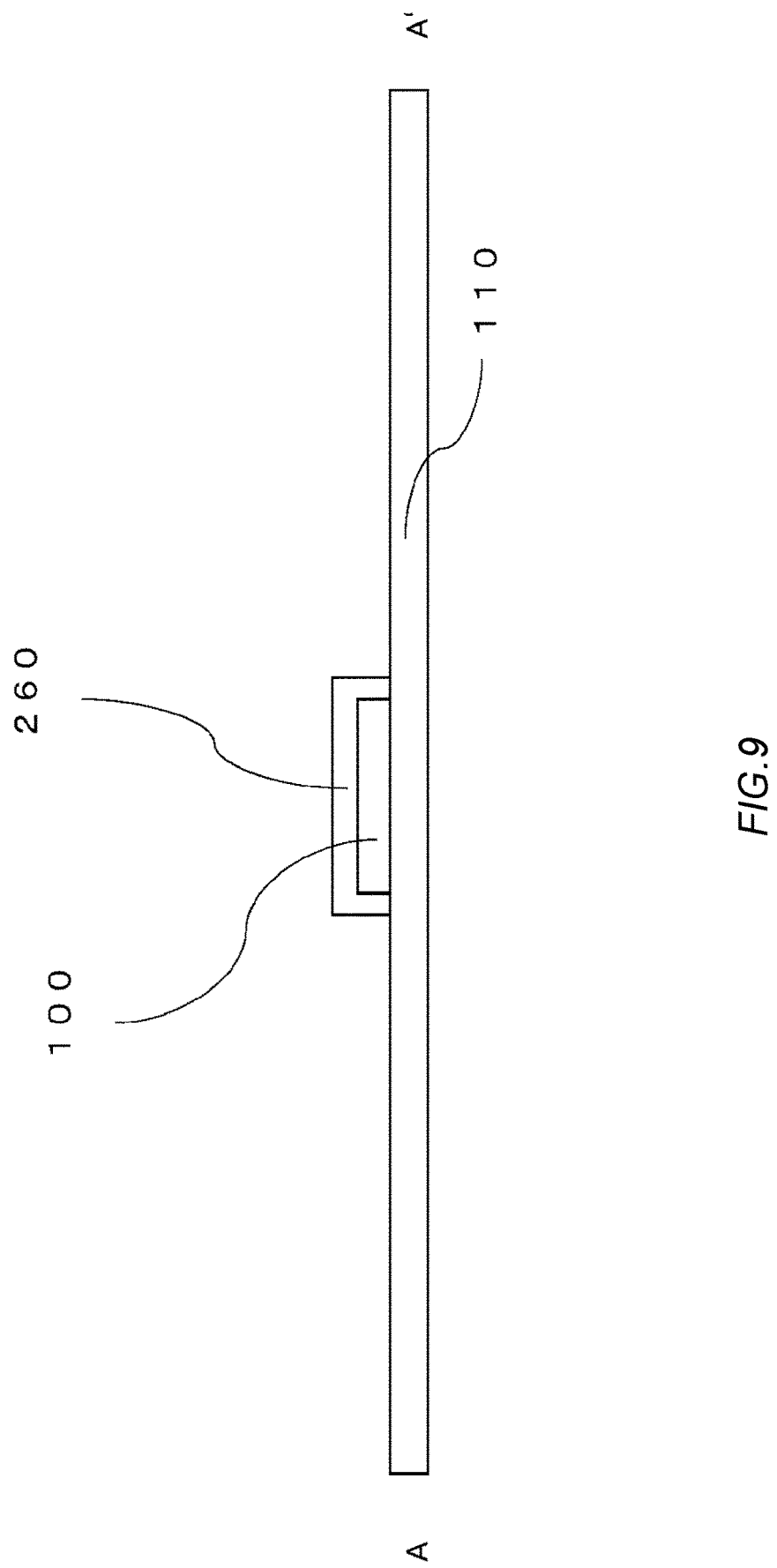
FIG. 9 is a cross-sectional view illustrating a configuration in which a semiconductor chip is covered with a heat spreader in the FC-BGA package having electrode pads on the surface, which is an example of the present embodiment.

As illustrated in FIG. 8 and FIG. 9, the semiconductor chip 100 is covered with a heat spreader 260, and is closely attached by a compound or the like having a high thermal conductivity. While a general VLSI has a heat dissipation fin on a heat spreader, the previous invention and the present invention are directly immersed. Thus, it is necessary to consider that intermittent boiling does not occur on the surface of the heat spreader. The heat spreader 260 is characterized in that its surface is metal oxide or sintered metal in order to prevent cavitation caused by intermittent boiling.

Bus Driver Switch in Lowermost Layer

The lowermost layer of the present embodiment may be a bus driver switch or a bus driver buffer switch of a DMA with a buffer with address bus snooping in units of page instead of simply relaying the local bus 420 and the external peripheral device.

Characteristics of Perforated Interposer Substrate

Figure 11:
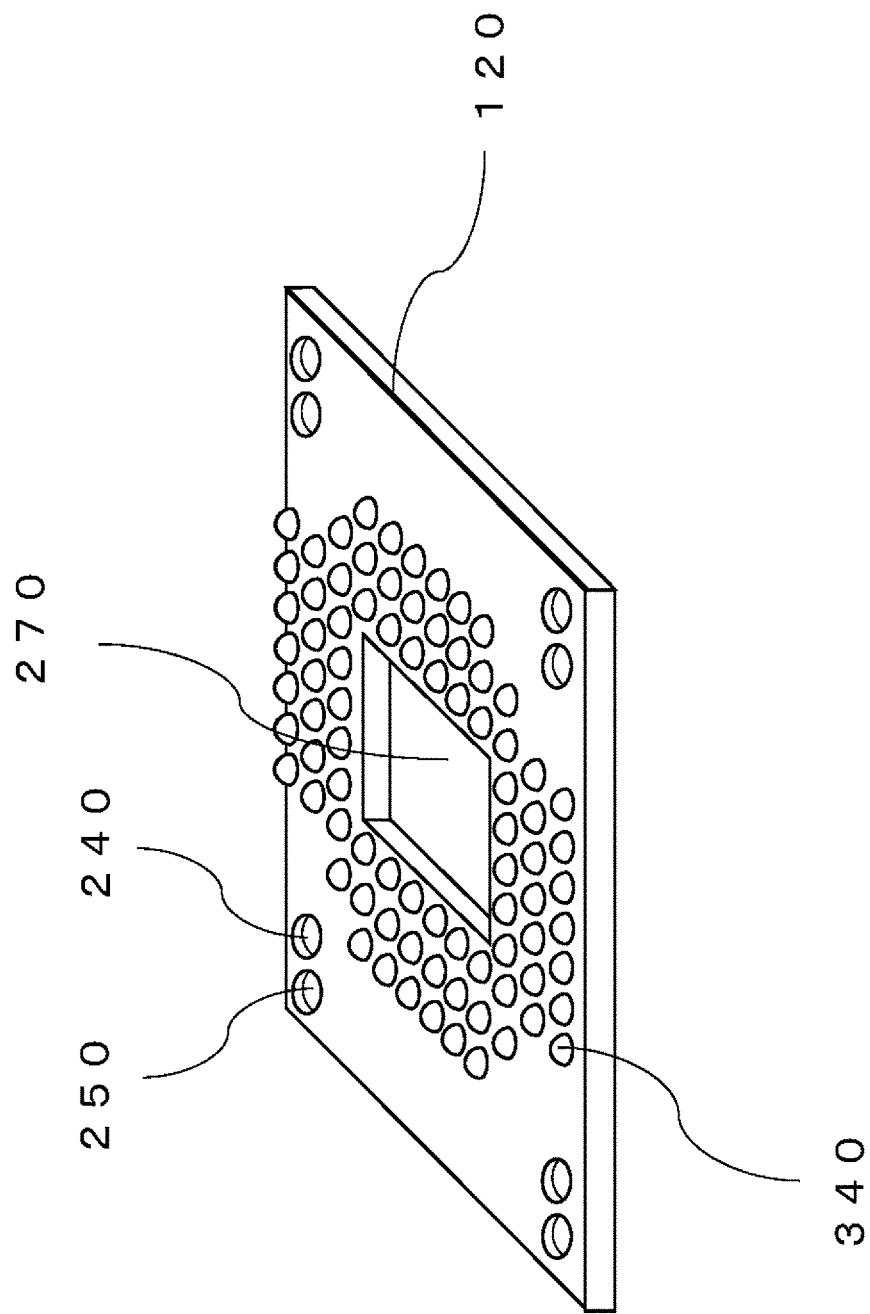
FIG. 11 is a perspective view of the back surface of the perforated interposer substrate which is an example of the present embodiment.

The perforated interposer substrate 120 illustrated in FIG. 10 includes an opening 270 at the center, the electrode pad 140 having a geometric shape for bonding the electrode terminals 340 of the FC-BGA package 110 having electrode pads on the surface to be stacked on the upper surface and the perforated interposer substrate 120, and the electrode terminal 340 on the back surface as illustrated in FIG. 11. The electrode pad 140 on the surface is electrically connected to the electrode terminal 340 on the back surface on a 1:1 basis. Further, the power supply electrode 240 as an anode which is a through hole for erecting a guide pin and the power supply electrode 250 as a cathode which is a through hole for erecting a guide pin are provided.

Figure 5:
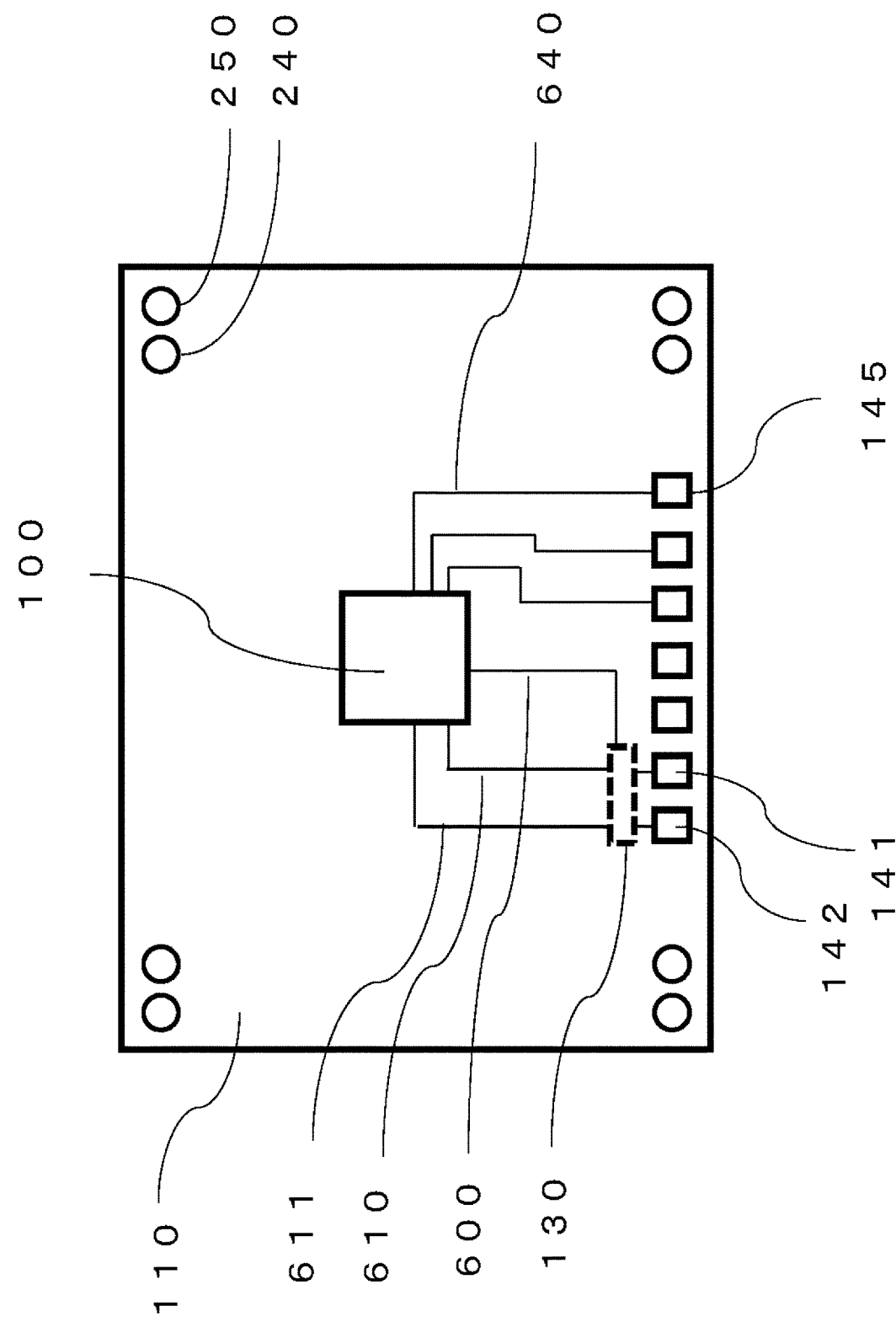
FIG. 5 is a schematic diagram of a bidirectional tri-state gate driver and a circuit of the FC-BGA package having electrode pads on the surface, which is an example of the present embodiment.

A Bidirectional Tri-State Gate Driver is Attached to the Side of the Semiconductor Chip FIG. 5 simply illustrates some internal circuits of the FC-BGA package 110 having electrode pads on the surface. For the description of the circuit portion, the FC-BGA package 110 having electrode pads on the surface in FIG. 1 to FIG. 3 is illustrated with some expressions omitted. As illustrated in FIG. 5, the FC-BGA package 110 having electrode pads on the surface includes the bidirectional tri-state gate driver 130 near the electrode pads 140 or the electrode terminals 340.

The FC-BGA package 110 having electrode pads on the surface includes the bidirectional tri-state gate driver 130, electrode pads 141 to 145, a gate control signal line 600, and data signal lines 610 to 611, in addition to the semiconductor chip 100. In FIG. 5, seven electrode terminals, one gate control signal line, and two data control signal lines are illustrated as an example in the present embodiment, but the present invention is not limited thereto. The number of electrode terminals may be one or more, the number of gate control signal lines may be one or more, and the number of data signal lines may be two or more.

The bidirectional tri-state gate driver 130 controls directions of signals flowing through the data signal line 610 and the data signal line 611 by a signal of the gate control signal line 600 from the semiconductor chip 100.

Figure 6:
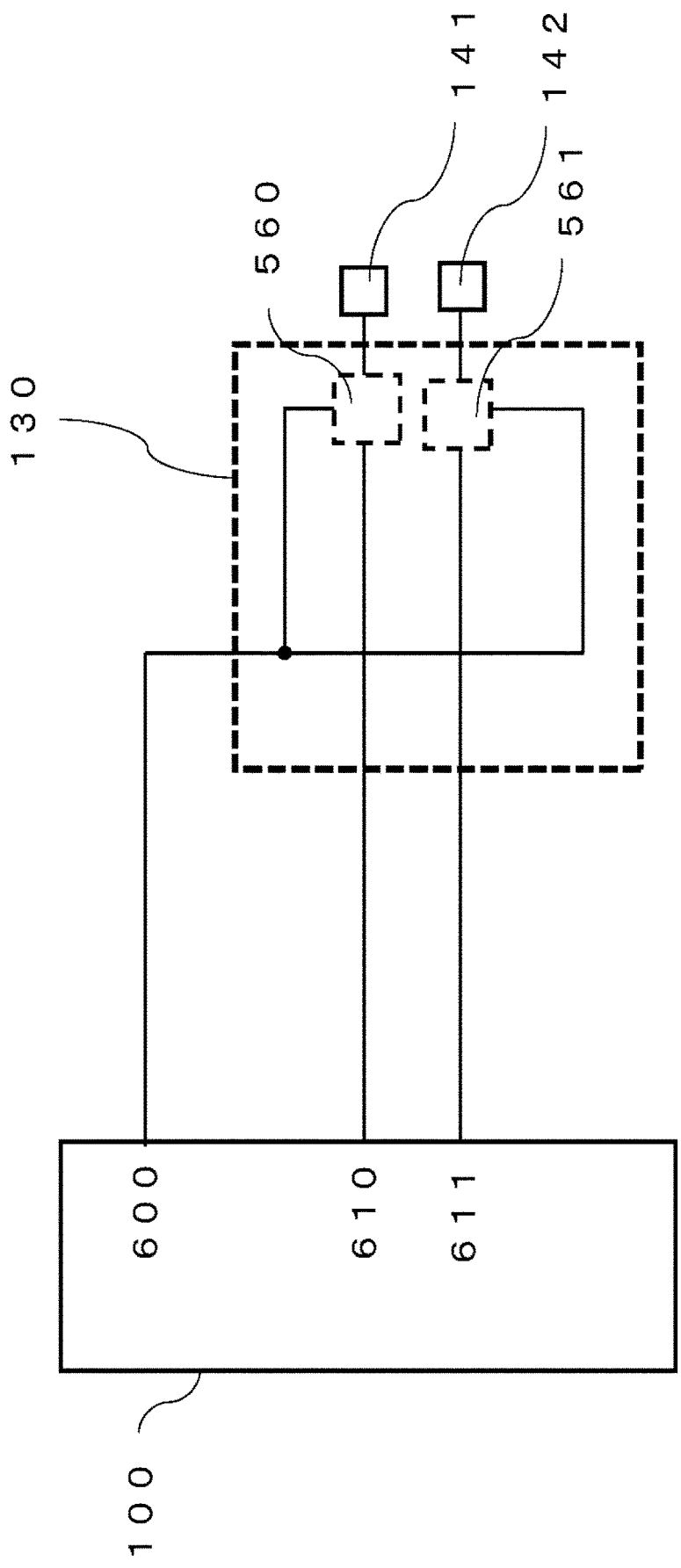
FIG. 6 is a schematic diagram of circuits inside and outside the bidirectional tri-state gate driver.
Figure 7:
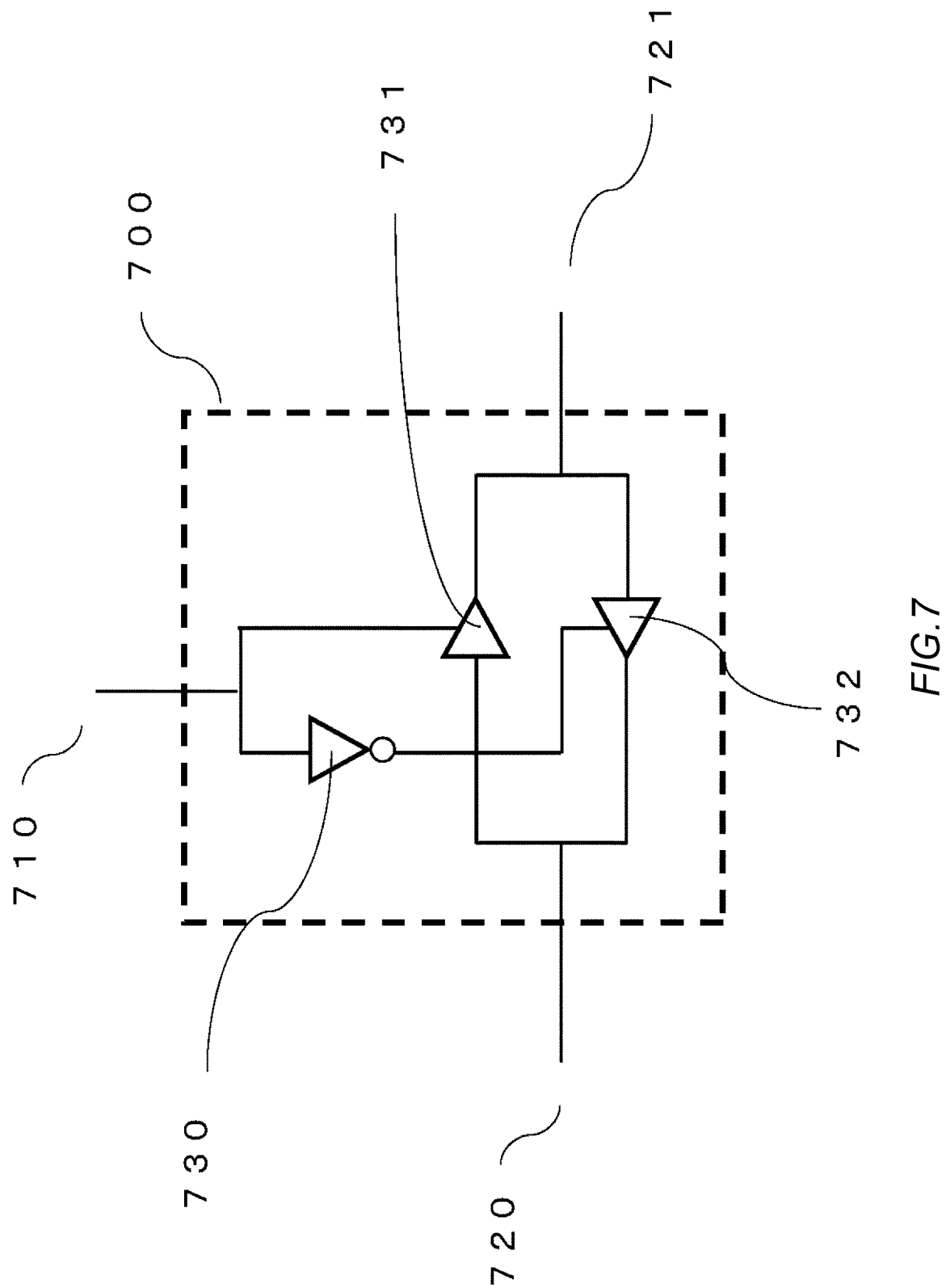
FIG. 7 is a schematic diagram of the bidirectional tri-state gate driver circuit.

FIG. 6 is a schematic diagram of a circuit for explaining the bidirectional tri-state gate driver 130. The bidirectional tri-state gate driver 130 is configured by a three-state buffer. The bidirectional tri-state gate driver has the circuit configuration illustrated in FIG. 7. When a gate control signal line 710 is "1", a three-state buffer 731 causes a signal of a data signal line 720 to flow in the direction of a data signal line 721. At this time, since "0" is transmitted to a three-state buffer 732 by a NOT circuit 730, high impedance is obtained. As a result, the data signal flows from left to right. Conversely, when the gate control signal line 710 is "0", the three-state buffers 731 have high impedance, and "1" is transmitted to the three-state buffers 732 by the NOT circuit 730, so that the data signal flows from the data signal line 721 in the direction of the data signal line 720 (from right to left).

Feature of FC-BGA Package Having Electrode Pads on Surface: Electrode and Guide Hole As illustrated in FIG. 3, the FC-BGA package 110 having electrode pads on the surface includes the semiconductor chip 100, the electrode pad 140 having a geometric shape for bonding the electrode terminals 340 of the FC-BGA package 110 or the perforated interposer substrate 120 having electrode pads on the surface to be stacked on the upper surface, the power supply electrode 240 as an anode which is a through hole for erecting a guide pin, and the power supply electrode 250 as a cathode which is a through hole for erecting a guide pin.

As illustrated in FIG. 4, the FC-BGA package 110 having electrode pads on the surface can include the ceramic capacitor 350 on the back surface of the FC-BGA package 110 having electrode pads on the surface as in the related art by inserting the perforated interposer substrate illustrated in the present invention therebetween.

Cooling Method is Performed by Ebullient Cooling of Immersion

In the present embodiment, it is possible to cope with cooling of a semiconductor of 100 W class by performing the ebullient cooling of immersion using fluorinate or the like.

Effect of Present Embodiment: Alignment at Time of Stacking is Refined by Guide Pin As illustrated in FIG. 1, in the present embodiment, it is necessary to accurately position and couple the electrode terminal 340 and the electrode pad 140 of the FC-BGA package 110 or the perforated interposer substrate 120 having electrode pads on the surface to be stacked. For this reason, the electrode pad 140 and the electrode terminal 340 can be accurately positioned at the time of stacking by inserting a power supply electrode 280 as an anode which is a guide pin and a power supply electrode 290 as a cathode which is a guide pin into the power supply electrode 240 as an anode which is a through hole for erecting a guide pin and the power supply electrode 250 as a cathode which is a through hole for erecting a guide pin, which are provided in the FC-BGA package 110 or the perforated interposer substrate 120 having electrode pads on the surface.

Effect of the Present Embodiment: Large Current Power can be Supplied to the Semiconductor Chip by Providing a Ceramic Capacitor in Each Layer As illustrated in FIG. 4, the FC-BGA package 110 having electrode pads on the surface can include the ceramic capacitor 350 on the back surface of the semiconductor of the FC-BGA package 110 having electrode pads on the surface. As a result, a ceramic capacitor required for operating a semiconductor chip in which a CPU, a GPGPU, a BBU, the core of a super computer, or the like consumes a large current is supplied for each layer, which allows a shortest path without using the electrode terminal 340 in the power supply path, and it is possible to supply a large current while suppressing impedance.

Effect of the Present Embodiment: Sufficient Refrigerant can be Secured by the Opening of the Perforated Interposer Substrate and the Plurality of Stacked Layers As illustrated in FIG. 10, the perforated interposer substrate 120 according to the present embodiment includes the opening 270 and is equipped with the electrode terminal 340, so that a space above or around the semiconductor chip 100 can be secured by stacking the electrode terminal on the FC-BGA package 110 having electrode pads on the surface. As a result, the refrigerant flowing from the gap between the electrode terminals 340 can secure a capacity required for cooling the semiconductor chip 100. In a case where the cooling capacity around the semiconductor chip 100 is insufficient when the number of the perforated interposer substrates 120 is one, it is possible to secure more space above or around the semiconductor chip 100 by stacking a plurality of perforated interposer substrates 120 of two or three.

Two-Layered in Layer

The semiconductor chip 100 placed in the FC-BGA package 110 having electrode pads is not a single layer, and may have two or more layers. Each package of the three-dimensional stacked integrated circuit of the present embodiment may have a cross-connected non-uniform memory access (NUMA) configuration. Interconnections between layers are bus connections due to restriction of the number of pins.

Figure 13:
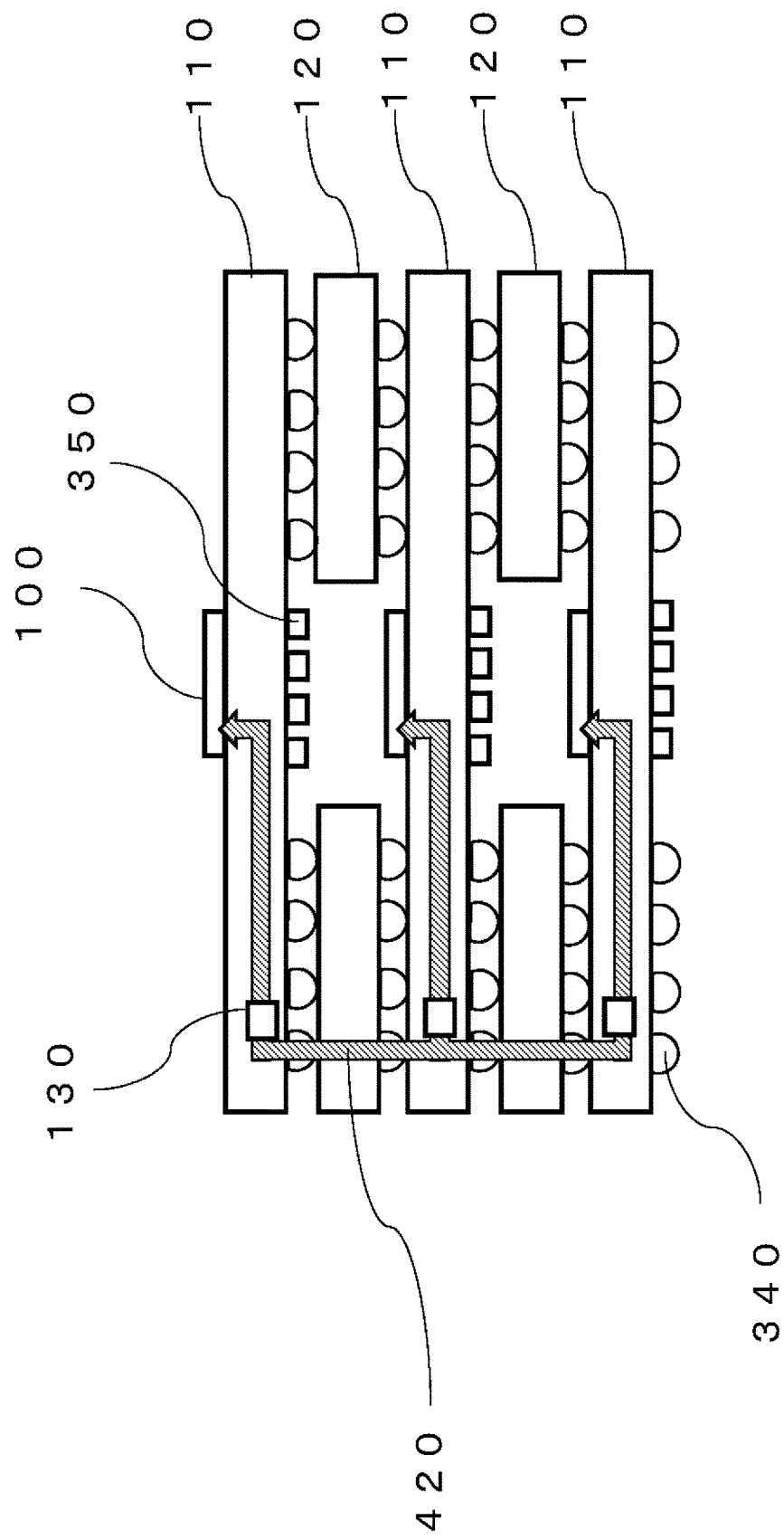
FIG. 13 is a conceptual diagram of the interlayer communication path provided with the bidirectional tri-state gate driver of the three-dimensional stacked integrated circuit which is an example of the present embodiment.

In Order to Describe the Effects of the Present Embodiment, Two Types of Interlayer Communication Paths Will be Described In the three-dimensional stacked integrated circuit according to the present embodiment, the electrode pad 140 and the electrode terminal 340 illustrated in FIG. 2 are bonded to form an interlayer communication path for performing communication with another layer in which a certain layer is stacked as illustrated in FIG. 12. The interlayer communication path includes two types of communication paths: a communication path (hereinafter, "maisonette connection") that is connected from a certain layer to an adjacent layer on a 1:1 basis; and a communication path (hereinafter, "local bus") that branches from a certain layer into a comb shape and is connected to each layer as illustrated in FIG. 13.

There is No Problem in 1:1 Maisonette Connection

A maisonette connection 430 (local connection connecting CPU, GPGPU, and cache or local memory of level 2 or level 3 of two adjacent layers) illustrated in FIG. 12 is configured by a data signal line 640 in the FC-BGA package 110 having electrode pads on the surface illustrated in FIG. 5 in the horizontal direction and the coupling between the electrode pad 140 and the electrode terminal 340 illustrated in FIG. 2 in the vertical direction. Since the path of the maisonette connection 430 is a point to point (P2P), there is no branch, and the start point and the end point are 1:1, reflection occurs. However, a special signal reflection problem such as slight overlapping of reflected waves does not occur.

The Local Bus has a Signal Reflection Problem

On the other hand, the local bus 420 illustrated in FIG. 12 and FIG. 13 is configured by the data signal line 610 and the bidirectional tri-state gate driver 130 in the FC-BGA package 110 having electrode pads on the surface illustrated in FIG. 5 in the horizontal direction, and the electrode pad 140 and the electrode terminal 340 illustrated in FIG. 2 in the vertical direction in order to couple the multiple layers in parallel. At this time, not only the communication path is coupled to the electrode pad 140 by the electrode terminal in the vertical direction, but also there is a signal line in each FC-BGA package connected in the horizontal direction in the semiconductor chip 100. Therefore, a comb-like circuit is formed, and a reflection pattern of a complicated signal is generated, which is a problem.

Reason for Reducing Adverse Effect of Reflection

Figure 18:
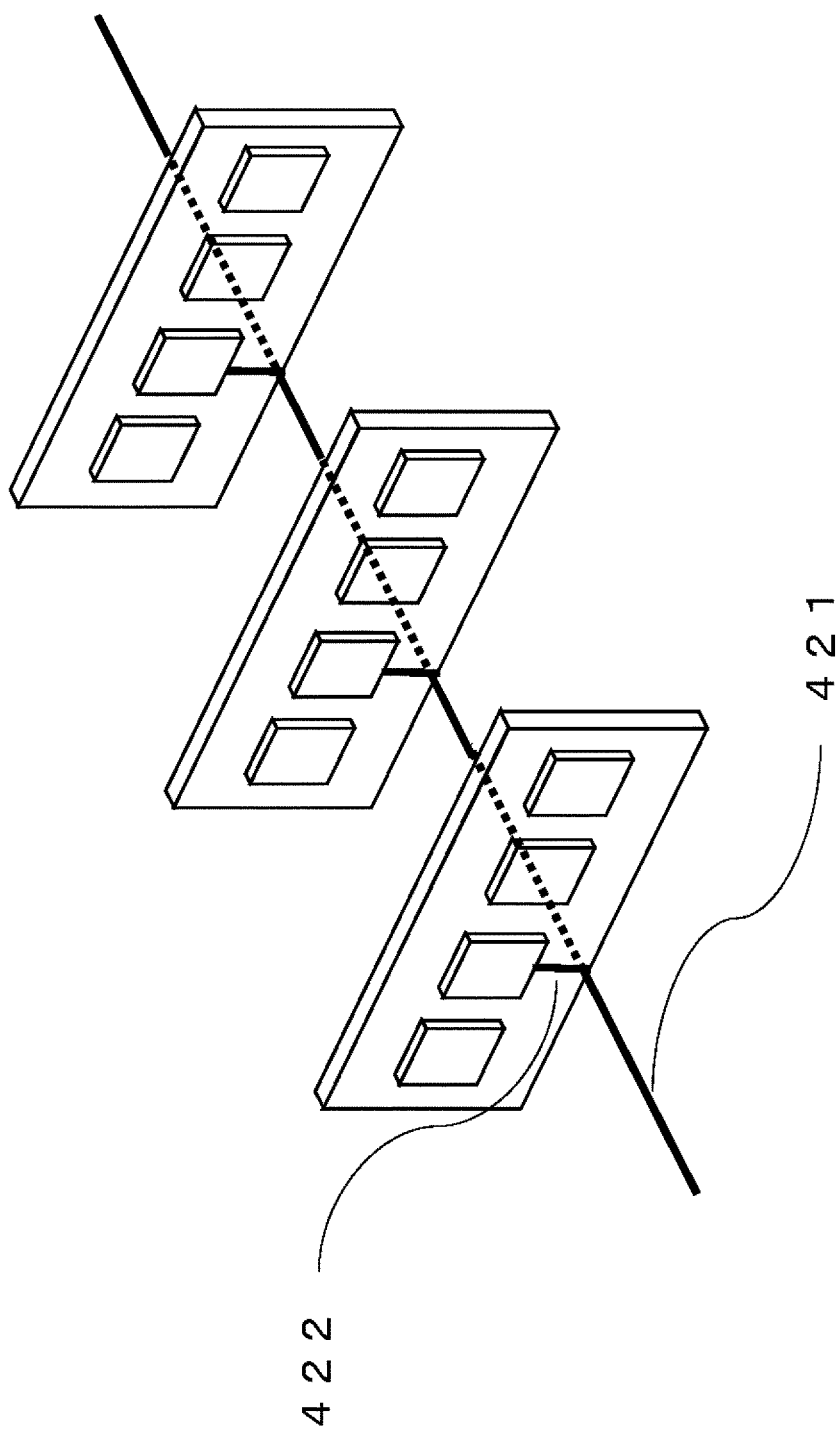
FIG. 18 is a diagram illustrating names of communication paths in a bus connection system.

FIG. 18 is a schematic diagram of a general bus circuit. A main bus, which is the center of the comb-like bus circuit, is a communication path in the vertical direction which is configured by the electrode terminal and the electrode pad in FIG. 13 of the present embodiment. A communication path extending in the horizontal direction from the main bus to an element (the bidirectional tri-state gate driver 130 in the present embodiment) that receives a signal is called a stub. In the absence of the bidirectional tri-state gate driver 130, the high-frequency signal flowing through the main bus illustrated in FIG. 13 has a characteristic of being reflected at the end point of each communication path, but the signal reflected in the stub returns to the main bus and is mixed with the original signal. The number of times of reflection increases as the number of stubs increases, and when reflected waves from many stubs are undesirably overlapped, the signal wave becomes too large, which may cause malfunction. Therefore, the stub is made as short as possible by making the bidirectional tri-state gate driver 130 adjacent to the electrode terminal, and the problem due to the influence of reflection is suppressed by bringing the bidirectional tri-state gate driver close to one communication path instead of having the comb shape.

Effect of the Present Embodiment: Solving the Problem of Comb-Like Irregular Reflection by Driving With a Bidirectional Tri-State Gate Driver Therefore, as illustrated in FIG. 5, the bidirectional tri-state gate driver 130 is provided to suppress reflection of a signal only in the vertical direction so as not to affect the communication path in the horizontal direction, and driving is performed by low voltage differential (LVD) using a pair of two adjacent terminals such as the electrode pad 141 and the electrode pad 142 to perform asynchronous transmission for each pair, thereby reducing the problem of signal reflection. As a result, the system using the present embodiment can operate at high speed without causing a serious malfunction only by aligning the line lengths of the interlayer communication paths. The PCI Express standard may be adopted for the interlayer communication. When the communication speed is insufficient, the clocked-up PCI Express standard may be adopted.

Effect of the Present Embodiment: Summary of Interlayer Communication Paths: High-Speed Communication Becomes Possible As a result, the influence of signal reflection on the interlayer communication path is minimized, and local bus connection can be stably realized at high speed. For details, a common inter-processor common bus technology is utilized.

Semiconductor Includes HBM in Addition to CPU

Figure 14:
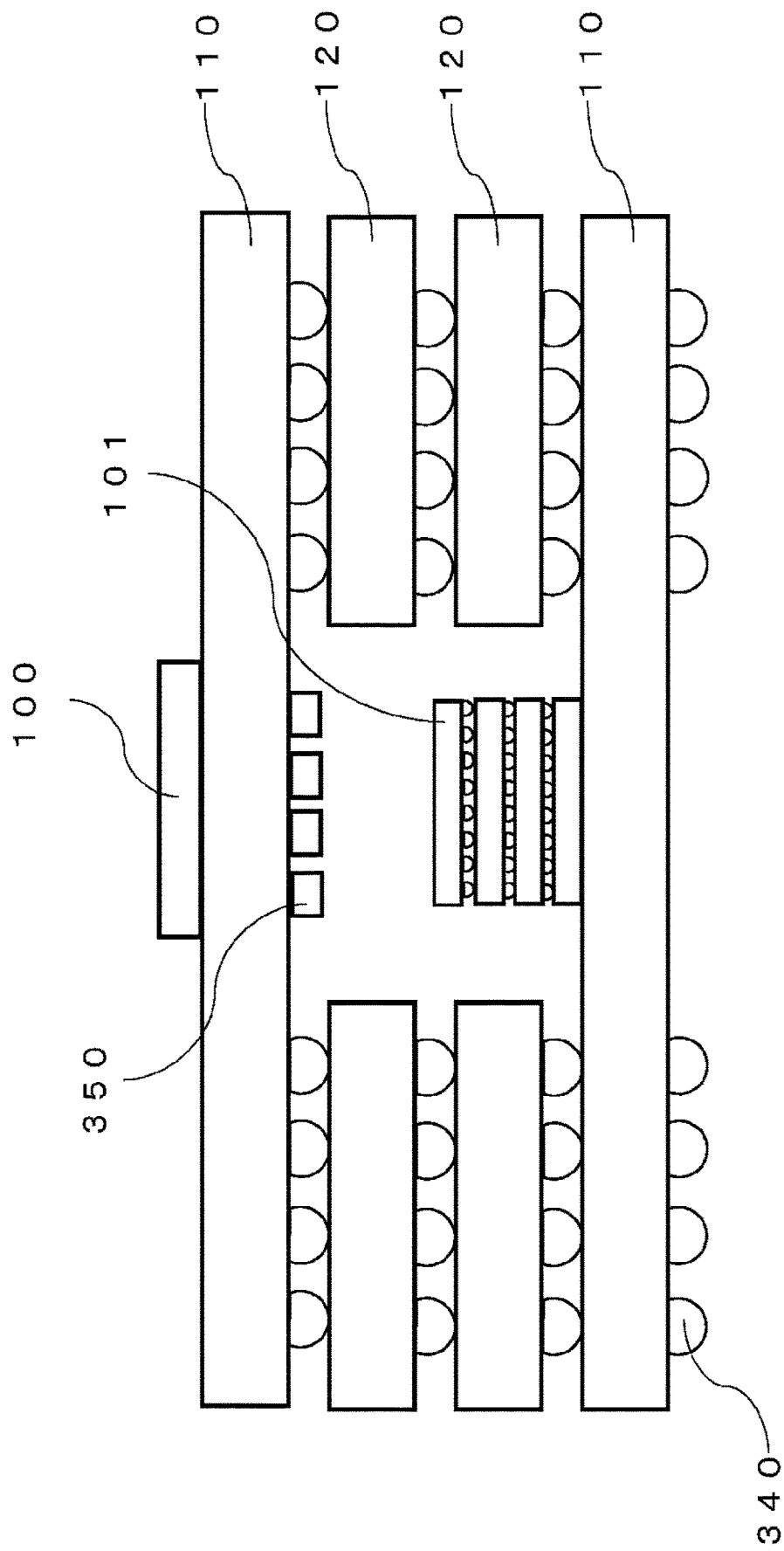
FIG. 14 is a diagram in which a thick semiconductor chip is mounted in the three-dimensional stacked integrated circuit which is an example of the present embodiment.
Figure 15:
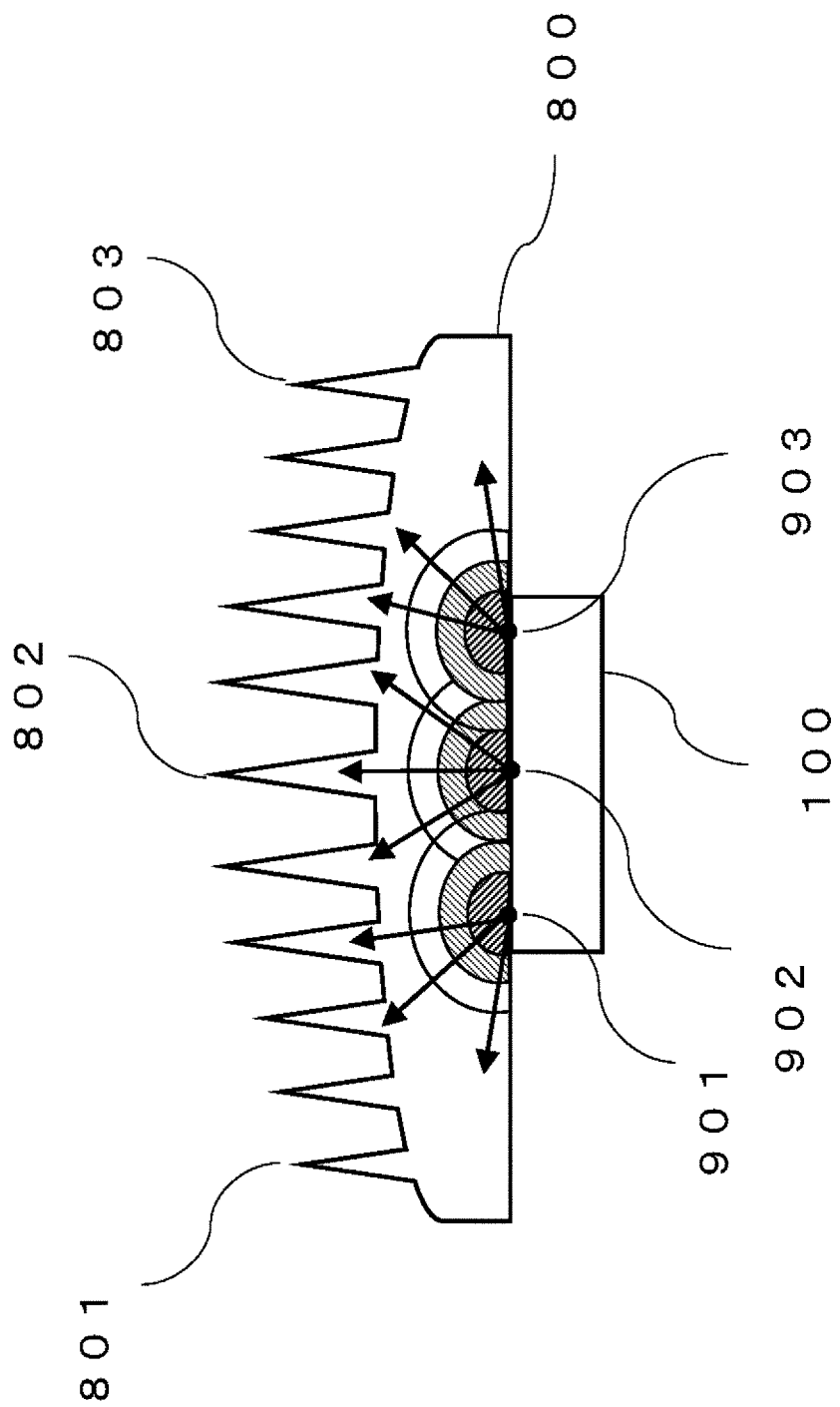
FIG. 15 is a schematic diagram in which heat of the semiconductor chip is propagated to a heat dissipation plate.
Figure 16:
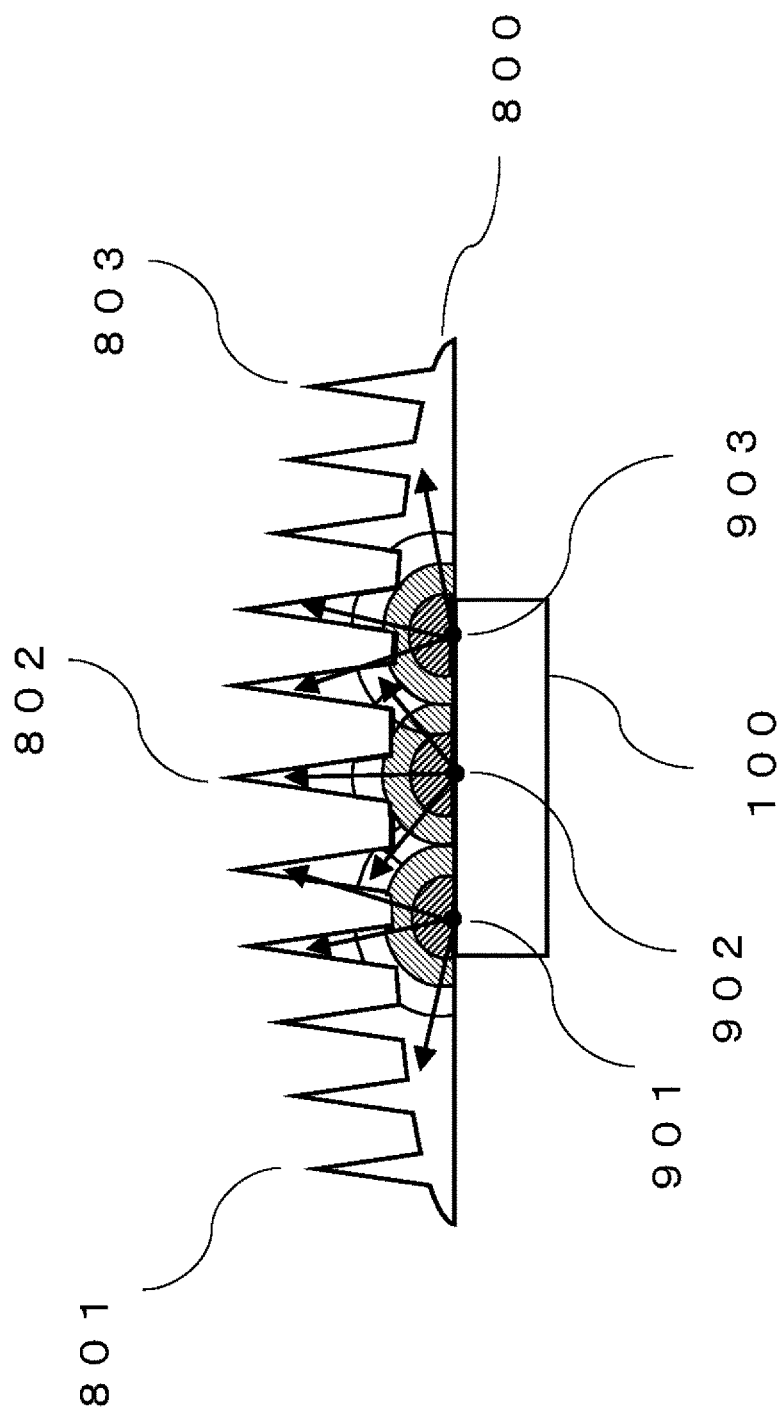
FIG. 16 is a schematic diagram in which heat of the semiconductor chip is propagated to a thin heat dissipation plate.

The semiconductor chip 100 mounted on the FC-BGA package 110 having electrode pads may be not only an arithmetic device such as a CPU or a GPGPU, but also a high bandwidth memory (HBM) or a wide I/O DRAM in which memory elements are stacked vertically. Although the memory elements are stacked vertically inside the HBM, as illustrated in FIG. 14, it is possible to vertically mount the memory elements on the FC-BGA package 110 having electrode pads by coupling them with low delay in the present invention so as to vertically stack the memory elements. This may be not only the lowermost layer but also any layer. The HBM or the wide I/O DRAM which is maisonette-connected is used as a local memory to form a NUMA configuration. The above-described maisonette-connected local memory is NUMA-connected to the local bus via an integrated circuit (CPU or GPGPU) in the internal bus of the three-dimensional integrated circuit. The local memory having the NUMA configuration is used as a fading area for saving the cache memory, thereby improving the throughput. The local memory is used as a working set when the cache fails. The local memory is used as a secondary cache. The use of the maisonette is a saving region of a cache area by HBM. As a NUMA configuration, when there are full of page buffers in a multiprocessor, the throughput is greatly improved if the buffers are in a NUMA memory.

Effect of the Present Embodiment: High-Speed Operation can be Performed by Using a Lowermost Layer as an External Bus Driver Switch The lowermost layer of the present embodiment may be a DMA with a buffer with address bus snooping in units of page instead of simply relaying the local bus 420 and the external peripheral device. When a system adopting the present embodiment is constructed, external bus connection with a main storage device, a peripheral device, or the like is required outside. However, if the FC-BGA package 110 having electrode pads on the surface of the lowermost layer of the present embodiment is an external bus driver switch, the external bus can be electrically disconnected. When the external bus connected from the lowermost layer of the present embodiment is separated by setting the external bus driver switch to high impedance, the signal propagation distance is extremely shortened, so that high-speed clock operation of the present embodiment can be performed. Since the signal is driven in a non-terminal connection, an operation mode is obtained in consideration of signal reflection similarly to the PCI bus.

Effect of the Present Embodiment: Cooling Efficiency is Increased by Using Metal Oxide or Sintered Metal on the Surface of the Semiconductor Chip The ebullient cooling is performed by a phase change of the refrigerant from liquid to gas. In the ebullient cooling, a large amount of gas (air bubbles) is generated in the refrigerant as much as possible, and vigorous expansion of the surrounding refrigerant leads to improvement of cooling efficiency. Although it is difficult to predict where the air bubbles are generated, it is desirable to cover the surface with a porous sintered metal or metal oxide because the air bubbles are likely to be generated from fine scratches on the surface of the heat source. Therefore, as illustrated in FIG. 8 and FIG. 9, the surface of the heat spreader 260 covering the semiconductor chip 100 is made of metal oxide or sintered metal, thereby improving cooling efficiency.

The embodiments described above are intended to facilitate understanding of the present invention, and are not intended to limit the present invention. Each element included in the embodiment and the arrangement, material, condition, shape, size, and the like thereof are not limited to those exemplified, and can be appropriately changed. In addition, it is possible to partially replace or combine the configurations illustrated in different embodiments.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: semiconductor chip; 101: stacked semiconductor chip such as HBM or wide I/O DRAM; 110: FC-BGA package having electrode pads on the surface; 120: perforated interposer substrate; 130: bidirectional tri-state gate driver; 131: bidirectional tri-state gate driver; 132: bidirectional tri-state gate driver; 133: bidirectional tri-state gate driver; 140: electrode pad; 141: electrode pad; 142: electrode pad; 145: electrode pad; 240: power supply electrode as an anode, which is a through hole for erecting a guide pin; 250: power supply electrode as a cathode, which is a through hole for erecting a guide pin; 260: heat spreader; 270: opening; 280: power supply electrode as an anode, which is a guide pin; 290: power supply electrode as a cathode, which is a guide pin; 340: electrode terminal; 350: ceramic capacitor; 410: one layer of the present embodiment; 420: conceptual diagram of local bus; 421: main bus; 422: stub; 430: conceptual diagram of maisonette connection; 560: bidirectional tri-state gate driver; 561: bidirectional tri-state gate driver; 600: gate control signal line; 610: data signal line; 611: data signal line; 640: data signal line; 700: bidirectional tri-state gate driver; 710: gate control signal line; 720: data signal line; 721: data signal line; 730: NOT circuit; 731: three-state buffer; 732: three-state buffer; 800: heat dissipation plate; 801: heat dissipation fin A; 802: heat dissipation fin B; 803: heat dissipation fin C; 901: heating point A; 902: heating point B; 903: heating point C

What is claimed is:

1. A three-dimensional stacked integrated circuit on a premise of immersion, comprising:
a first package provided with a semiconductor chip and electrode pads on an upper surface thereof and electrode terminals on a lower surface thereof,
a second package provided with a semiconductor chip and electrode pads on an upper surface thereof and electrode terminals on a lower surface thereof, and
an interposer substrate provided with electrode pads on an upper surface, electrode terminals on a lower surface and an opening at a position where the semiconductor chip on the second package is mounted, wherein
the first package and the interposer substrate, and the second package have a shape in which (i) a gap is generated in a stacking direction between the first package and the interposer substrate permitting cooling liquid to flow between the electrode terminals on the lower surface of the first package, and/or (ii) a gap is generated in a stacking direction between the interposer substrate and the second package permitting cooling liquid to flow between the electrode terminals on the lower surface of the interposer substrate,
the electrode pads of the interposer substrate and the second package have a geometric shape for connecting to the electrode terminals of the first package and the interposer substrate, respectively,
the electrode terminals and the electrode pads of the first package, the interposer substrate, and the second package are vertically electrically connected on a 1:1 basis,
guide holes for accurately positioning and holding connection at a time of stacking are provided in the first package, the interposer substrate, and the second package,
an interlayer communication path is formed at least one of (i) by at least one of the electrode terminals of the first package and at least one of the electrode pads of the interposer substrate by connection of the first package and the interposer substrate, (ii) by at least one of the electrode terminals of the interposer substrate and at least one of the electrode pads of the second package by connection of the interposer substrate and the second package, (iii) by at least one of the electrode terminals of the first package, at least one of the electrode pads of the interposer substrate, and at least one of the electrode pads of the second package by connection of the first package, the interposer substrate and the second package,
a cooling liquid flows in at least one of the gaps generated in the stacking direction between the first package and the interposer substrate or between the interposer and the second package to perform liquid immersion cooling, wherein the guide holes include adjacent pairs of guide holes in each corner of each of the first package, the interposer substrate, and the second package such that the adjacent pairs of guide holes are aligned with respective pins, wherein the adjacent pairs of guide holes are sufficiently adjacent so as to affect an impedance of power passing therethrough, the adjacent pairs of guide holes each form an anode electrode and a cathode electrode pair therethrough for supplying power to at least one of the semiconductor chip mounted on the first package and the semiconductor chip mounted on the second package, the adjacent pairs of guide holes are provided in pairs of two adjacent to each other to lower impedance of electrical power passing therethrough so that electric power can be directly supplied to a ceramic capacitor mounted on the first package and/or the second package, and each of the adjacent pairs of guide holes are aligned with an associated guide pin which forms a power via from the upper surface to the lower surface.

2. The three-dimensional stacked integrated circuit according to claim 1, further comprising:
a plurality of the interposer substrates,
a plurality of second packages,
wherein each of the plurality of interposer substrates is inserted between respective ones of the second packages.

3. The three-dimensional stacked integrated circuit according to claim 1, wherein
the semiconductor chip mounted in the first and/or second package is a three-dimensional semiconductor (HBM: High Bandwidth Memory or Wide I/O DRAM and so on) obtained by stacking two or more layers.

4. The three-dimensional stacked integrated circuit according to claim 1, wherein
at least one of the first package and the second package has a cross-connected non-uniform memory access (NUMA) configuration, and
interconnections between the first package, and the second package are bus connections.

5. The three-dimensional stacked integrated circuit according to claim 1, wherein
a data transmission system of the interlayer communication path is implemented by low voltage differential (LVD) with two of the electrode terminals adjacent as a pair.

6. The three-dimensional stacked integrated circuit according to claim 1, wherein
a data transmission system of the interlayer communication path is implemented by PCI Express with two of the electrode terminals adjacent as a pair.

7. The three-dimensional stacked integrated circuit according to claim 6, wherein clocked-up PCI Express is used.

8. The three-dimensional stacked integrated circuit according to claim 1, further comprising:
a bi-directional tri-state gate driver mounted adjacent to the electrode terminals of the first package in order to reduce an adverse effect of reflection of a high-frequency signal flowing through the interlayer communication path.

9. The three-dimensional stacked integrated circuit according to claim 1, further comprising:
a heat spreader closely attached to at least one of the semiconductor chip mounted on the first package or the second package comprising a sintered metal or a metal oxide in order to prevent cavitation caused by intermittent boiling in liquid immersion cooling.

10. The three-dimensional stacked integrated circuit according to claim 1, wherein
an integrated circuit of the second package as a lowermost layer of the three-dimensional stacked integrated circuit is configured by a bus driver switch or a bus driver switch of a DMA with a buffer with address bus snooping in units of page.

11. The three-dimensional stacked integrated circuit according to claim 2, wherein
the semiconductor chip mounted in the first package and/or the second package is a three-dimensional semiconductor (HBM: High Bandwidth Memory, Wide I/O DRAM, or the like) obtained by stacking two or more semiconductor layers.

12. The three-dimensional stacked integrated circuit according to claim 2, wherein
at least one of the first package and the second package has a cross-connected non-uniform memory access (NUMA) configuration, and interconnections between the first package, and the second package are bus connections.

13. The three-dimensional stacked integrated circuit according to claim 3, wherein
at least one of the first package and the second package has a cross-connected non-uniform memory access (NUMA) configuration, and interconnections between the first package, and the second package are bus connections.

14. The three-dimensional stacked integrated circuit according to claim 2, wherein
a data transmission system of the interlayer communication path is implemented by low voltage differential (LVD) with the two adjacent electrode terminals as a pair.

15. The three-dimensional stacked integrated circuit according to claim 3, wherein
a data transmission system of the interlayer communication path is implemented by low voltage differential (LVD) with the two adjacent electrode terminals as a pair.

16. The three-dimensional stacked integrated circuit according to claim 4, wherein
a data transmission system of the interlayer communication path is implemented by low voltage differential (LVD) with the two adjacent electrode terminals as a pair.

17. The three-dimensional stacked integrated circuit according to claim 3, further comprising:
a plurality of the interposer substrates,
a plurality of second packages,
wherein each of the plurality of interposer substrates is inserted between respective ones of the second packages.

18. The three-dimensional stacked integrated circuit according to claim 1, wherein
the interposer substrate inserted between the first package and the second package is a single interposer substrate.

19. The three-dimensional stacked integrated circuit according to claim 18, wherein
   the semiconductor chip mounted in the second package includes a single layer.

20. The three-dimensional stacked integrated circuit according to claim 1, wherein
   the semiconductor chip mounted in the second package includes a single layer.

21. The three-dimensional stacked integrated circuit according to claim 20, wherein
   the interposer substrate inserted between the first and second packages is a single interposer substrate.

22. The three-dimensional stacked integrated circuit according to claim 1, wherein
   a plurality of the interposer substrates, each of which is inserted between the first package and the second package, is continuously inserted.

\* \* \* \* \*